US010866455B2

United States Patent
Kumar et al.

(10) Patent No.: US 10,866,455 B2
(45) Date of Patent: Dec. 15, 2020

(54) DISPLAY DEVICES INCLUDING PHOTOCHROMIC-DICHROIC COMPOUNDS AND DICHROIC COMPOUNDS

(71) Applicant: PPG Industries Ohio, Inc., Cleveland, OH (US)

(72) Inventors: Anil Kumar, Murrysville, PA (US); Kevin W. Seybert, San Francisco, CA (US)

(73) Assignee: PPG Industries Ohio, Inc., Cleveland, OH (US)

(*) Notice: Subject to any disclaimer, the term of this patent is extended or adjusted under 35 U.S.C. 154(b) by 70 days.

(21) Appl. No.: 16/144,491

(22) Filed: Sep. 27, 2018

(65) Prior Publication Data
US 2019/0121196 A1    Apr. 25, 2019

Related U.S. Application Data

(60) Provisional application No. 62/574,398, filed on Oct. 19, 2017.

(51) Int. Cl.
*G02B 5/23* (2006.01)
*G02F 1/1335* (2006.01)
(Continued)

(52) U.S. Cl.
CPC .......... *G02F 1/133528* (2013.01); *C09K 9/02* (2013.01); *G02B 5/23* (2013.01);
(Continued)

(58) Field of Classification Search
CPC .. G02B 5/23; G02B 5/008; G02B 1/04; G02F 1/0126; B60J 3/04
(Continued)

(56) References Cited

U.S. PATENT DOCUMENTS 2,319,826 A   5/1943   Land
2,334,446 A   11/1943  Serrell
(Continued)

FOREIGN PATENT DOCUMENTS

EP    0313941 A1    5/1989
EP    0321563 B1    6/1989
(Continued)

OTHER PUBLICATIONS

Schadt, "Optics and Applications of Photo-Aligned Liquid Crystalline Surfaces", Nonlinear Optics, 2000, vol. 25, pp. 1-12.
(Continued)

*Primary Examiner* — Mohammed A Hasan
(74) *Attorney, Agent, or Firm* — The Webb Law Firm

(57) ABSTRACT

The present invention is directed towards a display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80%, and the second absorption state has a transmittance percentage of 10% to 50%. The invention is further directed to display devices comprising the display element, and methods of making the display element.

23 Claims, 1 Drawing Sheet

Coating layer stacking of display element of Example 2.

(51) Int. Cl.

| | | |
|---|---|---|
| *G02F 1/01* | (2006.01) | |
| *C09K 9/02* | (2006.01) | |
| *G02B 5/30* | (2006.01) | |
| *G02F 1/1337* | (2006.01) | |
| *C03C 4/06* | (2006.01) | |
| *H01L 27/15* | (2006.01) | |
| *H01L 27/32* | (2006.01) | |

(52) U.S. Cl.
CPC ......... *G02B 5/3025* (2013.01); *G02B 5/3083* (2013.01); *G02F 1/0126* (2013.01); *G02F 1/133711* (2013.01); *C03C 4/06* (2013.01); *G02F 2202/14* (2013.01); *H01L 27/156* (2013.01); *H01L 27/3244* (2013.01)

(58) Field of Classification Search
USPC ....................................................... 359/241
See application file for complete search history.

(56) References Cited

U.S. PATENT DOCUMENTS

| | | |
|---|---|---|
| 2,475,921 A | 7/1949 | Smith |
| 2,481,830 A | 9/1949 | Dreyer |
| 2,544,659 A | 3/1951 | Dreyer |
| 3,276,316 A | 10/1966 | Makas |
| 3,361,706 A | 1/1968 | Meriwether et al. |
| 3,653,863 A | 4/1972 | Araujo et al. |
| 4,039,254 A | 8/1977 | Harsch |
| 4,043,637 A | 8/1977 | Hovey |
| 4,049,338 A | 9/1977 | Slocum |
| 4,110,015 A | 8/1978 | Reddy |
| 4,166,043 A | 8/1979 | Uhlmann et al. |
| 4,190,330 A | 2/1980 | Berreman |
| 4,279,474 A | 7/1981 | Belgorod |
| 4,309,082 A | 1/1982 | Kohara et al. |
| 4,367,170 A | 1/1983 | Uhlmann et al. |
| 4,549,894 A | 10/1985 | Araujo et al. |
| 4,556,605 A | 12/1985 | Mogami et al. |
| 4,637,896 A | 1/1987 | Shannon |
| 4,648,925 A | 3/1987 | Goepfert et al. |
| 4,683,153 A | 7/1987 | Goepfert et al. |
| 4,685,783 A | 8/1987 | Heller et al. |
| 4,728,173 A | 3/1988 | Toth |
| 4,756,605 A | 7/1988 | Okada et al. |
| 4,756,973 A | 7/1988 | Sakagami et al. |
| 4,810,433 A | 3/1989 | Takayanagi et al. |
| 4,838,673 A | 6/1989 | Richards et al. |
| 4,863,763 A | 9/1989 | Takeda et al. |
| 4,865,668 A | 9/1989 | Goepfert et al. |
| 4,873,026 A | 10/1989 | Behre et al. |
| 4,873,029 A | 10/1989 | Blum |
| 4,931,220 A | 6/1990 | Haynes et al. |
| 4,974,941 A | 12/1990 | Gibbons et al. |
| 4,977,028 A | 12/1990 | Goepfert et al. |
| 5,024,850 A | 6/1991 | Broer et al. |
| 5,067,795 A | 11/1991 | Senatore |
| 5,073,294 A | 12/1991 | Shannon et al. |
| 5,130,058 A | 7/1992 | Tanaka et al. |
| 5,130,353 A | 7/1992 | Fischer et al. |
| 5,139,707 A | 8/1992 | Guglielmetti et al. |
| 5,155,607 A | 10/1992 | Inoue et al. |
| 5,166,345 A | 11/1992 | Akashi et al. |
| 5,180,470 A | 1/1993 | Smith et al. |
| 5,185,390 A | 2/1993 | Fischer et al. |
| 5,189,448 A | 2/1993 | Yaguchi |
| 5,200,116 A | 4/1993 | Heller et al. |
| 5,202,053 A | 4/1993 | Shannon |
| 5,247,377 A | 9/1993 | Omeis et al. |
| 5,289,547 A | 2/1994 | Ligas et al. |
| 5,359,085 A | 10/1994 | Iwamoto et al. |
| 5,389,698 A | 2/1995 | Chigrinov et al. |
| 5,464,669 A | 11/1995 | Kang et al. |
| 5,543,267 A | 8/1996 | Stumpe et al. |
| 5,550,661 A | 8/1996 | Clark et al. |
| 5,602,661 A | 2/1997 | Schadt et al. |
| 5,608,567 A | 3/1997 | Grupp |
| 5,641,846 A | 6/1997 | Bieringer et al. |
| 5,644,416 A | 7/1997 | Morikawa et al. |
| 5,645,767 A | 7/1997 | Van Gemert |
| 5,658,501 A | 8/1997 | Kumar et al. |
| 5,698,141 A | 12/1997 | Kumar |
| 5,723,072 A | 3/1998 | Kumar |
| 5,746,949 A | 5/1998 | Shen et al. |
| 5,846,452 A | 12/1998 | Gibbons et al. |
| 5,903,330 A | 5/1999 | Funfschilling et al. |
| 5,943,104 A | 8/1999 | Moddel et al. |
| 5,948,487 A | 9/1999 | Sahouani et al. |
| 5,952,515 A | 9/1999 | Melzig et al. |
| 5,962,617 A | 10/1999 | Slagel |
| 6,022,497 A | 2/2000 | Kumar |
| 6,025,026 A | 2/2000 | Smith et al. |
| 6,036,890 A | 3/2000 | Melzig et al. |
| 6,049,428 A | 4/2000 | Khan et al. |
| 6,060,001 A | 5/2000 | Welch et al. |
| 6,080,338 A | 6/2000 | Kumar |
| 6,113,814 A | 9/2000 | Gemert et al. |
| 6,136,968 A | 10/2000 | Chamontin et al. |
| 6,150,430 A | 11/2000 | Walters et al. |
| 6,153,126 A | 11/2000 | Kumar |
| 6,160,597 A | 12/2000 | Schadt et al. |
| 6,187,444 B1 | 2/2001 | Bowles, III et al. |
| 6,239,778 B1 | 5/2001 | Palffy-Muhoray et al. |
| 6,245,399 B1 | 6/2001 | Sahouani et al. |
| 6,268,055 B1 | 7/2001 | Walters et al. |
| 6,281,366 B1 | 8/2001 | Frigoli et al. |
| 6,284,418 B1 | 9/2001 | Trantolo |
| 6,296,785 B1 | 10/2001 | Nelson et al. |
| 6,312,811 B1 | 11/2001 | Frigoli et al. |
| 6,328,446 B1 | 12/2001 | Bhalakia et al. |
| 6,334,681 B1 | 1/2002 | Perrott et al. |
| 6,338,808 B1 | 1/2002 | Kawata et al. |
| 6,348,604 B1 | 2/2002 | Nelson et al. |
| 6,353,102 B1 | 3/2002 | Kumar |
| 6,369,869 B2 | 4/2002 | Schadt et al. |
| 6,432,544 B1 | 8/2002 | Stewart et al. |
| 6,433,043 B1 | 8/2002 | Misura et al. |
| 6,436,525 B1 | 8/2002 | Welch et al. |
| 6,474,695 B1 | 11/2002 | Schneider et al. |
| 6,506,488 B1 | 1/2003 | Stewart et al. |
| 6,531,076 B2 | 3/2003 | Crano et al. |
| 6,555,028 B2 | 4/2003 | Walters et al. |
| 6,590,707 B1 | 7/2003 | Weber |
| 6,597,422 B1 | 7/2003 | Funfschilling et al. |
| 6,602,603 B2 | 8/2003 | Welch et al. |
| 6,613,433 B2 | 9/2003 | Yamamoto et al. |
| 6,621,616 B1 | 9/2003 | Bauer et al. |
| 6,630,597 B1 | 10/2003 | Lin et al. |
| 6,641,874 B2 | 11/2003 | Kuntz et al. |
| 6,690,495 B1 | 2/2004 | Kosa et al. |
| 6,705,569 B1 | 3/2004 | Sanders et al. |
| 6,717,644 B2 | 4/2004 | Schadt et al. |
| 6,723,072 B2 | 4/2004 | Flaherty et al. |
| 6,761,452 B2 | 7/2004 | Moravec et al. |
| 6,844,686 B1 | 1/2005 | Schneck et al. |
| 6,853,423 B2 | 2/2005 | Arakawa et al. |
| 6,863,848 B2 | 3/2005 | Engardio et al. |
| 6,864,932 B2 | 3/2005 | Miyatake et al. |
| 6,874,888 B1 | 4/2005 | Dudai |
| 6,958,860 B2 | 10/2005 | Dontula et al. |
| 6,963,437 B2 | 11/2005 | Bauer et al. |
| 6,999,220 B2 | 2/2006 | Kosa et al. |
| 7,004,583 B2 | 2/2006 | Miniutti et al. |
| 7,097,303 B2 | 8/2006 | Kumar et al. |
| 7,245,347 B2 | 7/2007 | Lundgren |
| 7,256,921 B2 * | 8/2007 | Kumar ................. C07D 498/10 359/241 |
| 7,342,112 B2 | 3/2008 | Kumar et al. |
| 7,349,138 B2 | 3/2008 | Kumar et al. |
| 7,394,585 B2 | 7/2008 | Kumar et al. |
| 7,465,415 B2 | 12/2008 | Wang et al. |
| 7,505,189 B2 | 3/2009 | Kumar et al. |
| 7,632,540 B2 | 12/2009 | Kumar et al. |
| 7,978,391 B2 | 7/2011 | Kumar et al. |

(56) References Cited

U.S. PATENT DOCUMENTS

| | | | |
|---|---|---|---|
| 8,089,678 B2 * | 1/2012 | Kumar | G02B 5/3083 359/241 |
| 8,649,081 B1 | 2/2014 | DeMeio et al. | |
| 9,475,901 B2 | 10/2016 | Saha et al. | |
| 2002/0039627 A1 | 4/2002 | Ichihashi et al. | |
| 2002/0090516 A1 | 7/2002 | Loshak et al. | |
| 2002/0167639 A1 | 11/2002 | Coates et al. | |
| 2002/0180916 A1 | 12/2002 | Schadt et al. | |
| 2003/0008958 A1 | 1/2003 | Momoda et al. | |
| 2003/0045612 A1 | 3/2003 | Misura et al. | |
| 2003/0189684 A1 | 10/2003 | Kuntz et al. | |
| 2003/0214625 A1 | 11/2003 | Arakawa et al. | |
| 2004/0046927 A1 | 3/2004 | Montgomery | |
| 2004/0090570 A1 | 5/2004 | Kosa et al. | |
| 2004/0125337 A1 | 7/2004 | Boulineau et al. | |
| 2004/0158028 A1 | 8/2004 | Buhler | |
| 2004/0223221 A1 | 11/2004 | Sugmura et al. | |
| 2005/0003107 A1 | 1/2005 | Kumar et al. | |
| 2005/0004361 A1 | 1/2005 | Kumar et al. | |
| 2005/0012998 A1 | 1/2005 | Kumar et al. | |
| 2005/0146680 A1 | 7/2005 | Mulsener et al. | |
| 2006/0007371 A1 | 1/2006 | Miyatake et al. | |
| 2007/0041073 A1 | 2/2007 | Kumar et al. | |
| 2009/0135462 A1 | 5/2009 | Kumar et al. | |
| 2011/0291552 A1 | 12/2011 | Kwon et al. | |
| 2014/0334026 A1 | 11/2014 | Gross et al. | |
| 2018/0210330 A1 | 7/2018 | Tomasulo et al. | |

FOREIGN PATENT DOCUMENTS

| | | |
|---|---|---|
| EP | 0446717 A2 | 9/1991 |
| EP | 0488164 A2 | 6/1992 |
| EP | 0619358 A1 | 3/1993 |
| EP | 0543678 A1 | 5/1993 |
| EP | 0397263 B1 | 12/1994 |
| EP | 0686685 B1 | 12/1995 |
| EP | 0331233 B1 | 4/1997 |
| EP | 0770116 A1 | 5/1997 |
| EP | 0772069 A1 | 5/1997 |
| EP | 0965628 A1 | 12/1999 |
| EP | 1162482 A2 | 12/2001 |
| EP | 1184379 A1 | 3/2002 |
| EP | 1203967 A1 | 5/2002 |
| EP | 1394595 A1 | 3/2004 |
| GB | 583842 A | 1/1947 |
| GB | 2169417 A | 7/1986 |
| JP | 59135428 A | 8/1984 |
| JP | 64090286 A | 4/1989 |
| JP | 03200118 A | 9/1991 |
| JP | 03200218 A | 9/1991 |
| JP | 07062337 A | 3/1995 |
| JP | 2013251376 A | 12/2013 |
| WO | 8905464 A1 | 6/1989 |
| WO | 8911674 A1 | 11/1989 |
| WO | 9201959 A1 | 2/1992 |
| WO | 9317071 A1 | 9/1993 |
| WO | 9601884 A1 | 1/1996 |
| WO | 9705213 A1 | 2/1997 |
| WO | 9722894 A1 | 6/1997 |
| WO | 9819207 A1 | 5/1998 |
| WO | 9920630 A1 | 4/1999 |
| WO | 0015630 A1 | 3/2000 |
| WO | 0019252 A1 | 4/2000 |
| WO | 0077599 A1 | 12/2000 |
| WO | 0102449 A2 | 1/2001 |
| WO | 0119813 A1 | 3/2001 |
| WO | 0155960 A1 | 8/2001 |
| WO | 0170719 A2 | 9/2001 |
| WO | 0229489 A2 | 4/2002 |
| WO | 02058921 A1 | 8/2002 |
| WO | 03019270 A1 | 3/2003 |
| WO | 03032066 A1 | 4/2003 |
| WO | 2004003107 A1 | 1/2004 |
| WO | 2001041961 A1 | 5/2004 |
| WO | 2005084826 A1 | 9/2005 |
| WO | 2005085912 A1 | 9/2005 |
| WO | 2017039669 A1 | 3/2017 |

OTHER PUBLICATIONS

Schadt, "Surface-Induced Parallel Alignment of Liquid Crystals by Linearly Polymerized Photopolymers", Japanese Journal of Applied Physics, vol. 31, No. 7, Jul. 1992, pp. 2155-2164.

* cited by examiner

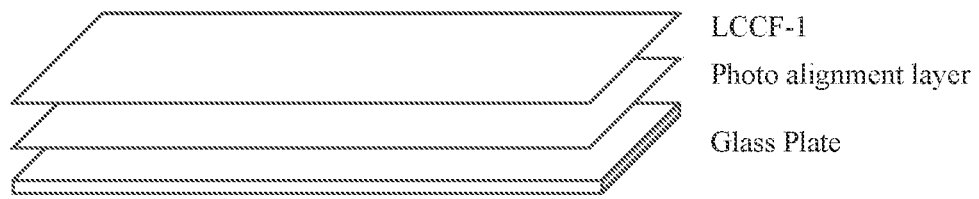
Figure 1: Coating layer stacking of display element of Example 1.
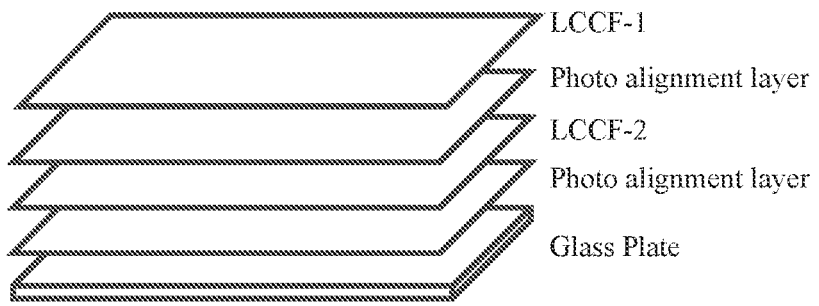
Figure 2: Coating layer stacking of display element of Example 2.
Figure 3: Coating layer stacking of display element of Example 3.

DISPLAY DEVICES INCLUDING PHOTOCHROMIC-DICHROIC COMPOUNDS AND DICHROIC COMPOUNDS

FIELD OF THE INVENTION

The present invention is directed towards display elements and devices comprising photochromic-dichroic compounds and dichroic compounds.

BACKGROUND INFORMATION

Display screens on mobile devices, ATMs, and other machines that may be used outdoors often have problems with sunlight readability, UV degradation, durability, operating temperature range, and lifetime. Sunlight readability may be improved in a number of ways. One solution is to actively increase the backlight intensity by adding more cold-cathode-fluorescent-lamp (CCFL) backlight tubes. Unfortunately, this approach has drawbacks in most mobile device applications because of battery drain, larger device size, heat generation, and weight considerations. A second approach is to passively increase backlight intensity by adding brightness-enhancement films to the optical stack of the display screen. While avoiding most of the drawbacks of the active approach, this solution only increases brightness by a factor of about two, which is insufficient to solve the sunlight readability problem. A third solution is the minimization of reflected light, such as through the use of anti-reflective coatings and films and circular polarizers. Each of these solutions may be combined with others to optimize the desired effect.

Most mobile devices today use a circular polarizer. A circular polarizer is an assembly of a conventional linearly polarizing element and a quarter wave retarder. The axis of the retarder is oriented at 45 degrees with respect to the axis of the linear polarizer. As incident light passes through the assembly, it is converted to circularly polarized light. Circular polarizers have traditionally been used for their anti-reflective properties. In such applications, when light is reflected back from a specular surface through the retarder, the plane of polarization is rotated 90 degrees with respect to the original orientation so the linear polarizer blocks the returning reflected light. However, in order to achieve sunlight readability, the circular polarizer must absorb a large amount of the transmitted radiation, typically about 60% of the transmitted radiation is absorbed. While such a high-level of absorbance is necessary for sunlight readability, the large amount of absorbance is not necessary indoors. However, the amount of absorbance of a circular polarizer is fixed, and, therefore, a high-level of brightness must be emitted from the light-emitting source for the phone's display to be visible and overcome the absorbance of the circular polarizer. This results in a considerable waste of battery energy.

It would be desirable to provide a display that provides good readability in bright and dark conditions, and that improves the battery life of a display device.

SUMMARY OF THE INVENTION

Disclosed herein is a display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80%, and the second absorption state has a transmittance percentage of 10% to 50%.

Also disclosed herein is a display device comprising the display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80%, and the second absorption state has a transmittance percentage of 10% to 50%.

BRIEF DESCRIPTION OF THE DRAWINGS

FIG. 1 is a layer stacking configuration of the display element according to Example 1. A glass plate is coated with a photoalignment layer and a liquid crystal coating formulation (LCCF-1).

FIG. 2 is a layer stacking configuration of the display element according to Example 2. A glass plate is coated with a photoalignment layer, a liquid crystal coating formulation (LCCF-2), a second photoalignment layer, and a second liquid crystal coating formulation (LCCF-1).

FIG. 3 is a layer stacking configuration of the display element according to Example 3. A glass plate is coated with a photoalignment layer and a liquid crystal coating formulation (LCCF-3).

DETAILED DESCRIPTION OF THE INVENTION

As stated above, the present invention is directed to a display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80%, and the second absorption state has a transmittance percentage of 10% to 50%.

According to the present invention, the display element comprises a photochromic-dichroic compound. The photochromic-dichroic compound has a first absorption state and a second absorption state, wherein the photochromic-dichroic material switches from the first state to the second state in response to actinic radiation, reverting back to the first state in response to actinic and/or thermal energy, and may demonstrate linear polarization both of the first state and the second state. As used herein the term "photochromic-dichroic" means displaying both photochromic and dichroic (i.e., linearly polarizing) properties under certain conditions, which properties are at least detectible by instrumentation. Accordingly, "photochromic-dichroic compounds" are compounds displaying both photochromic and dichroic (i.e., linearly polarizing) properties under certain conditions, which properties are at least detectible by instrumentation. As used herein, the term "linearly polarize" means to confine the vibrations of the electric vector of light waves to one direction. Thus, photochromic-dichroic compounds have an absorption spectrum for at least visible radiation that varies in response to at least actinic radiation and are capable of absorbing one of two orthogonal plane polarized components of at least transmitted radiation more strongly than the other. Accordingly, the display element may have an absorption spectrum for at least visible radiation that varies in response to at least actinic radiation and may be capable of absorbing one of two orthogonal plane polarized components of at least transmitted radiation more strongly than the other.

The photochromic-dichroic compound of the display element may be non-polarizing in the first state (that is, the photochromic-dichroic compound will not confine the vibrations of the electric vector of light waves to one direction) and linearly polarizing transmitted radiation in the second state. As used herein the term "transmitted radiation" refers to radiation that is passed through at least a portion of an object. Although not limiting herein, the transmitted radiation can be ultraviolet radiation, visible radiation, or a combination thereof. Thus, the photochromic-dichroic material may be non-polarizing in the first state and linearly polarizing transmitted ultraviolet radiation, transmitted visible radiation, or a combination thereof in the second state.

Additionally, the photochromic-dichroic compounds disclosed herein may be thermally reversible. That is, the photochromic-dichroic compounds can switch from a first state to a second state in response to actinic radiation and revert back to the first state in response to thermal energy.

Non-limiting examples of photochromic-dichroic compounds suitable for use in the display element disclosed herein include the compounds listed below and the compounds described in U.S. Pat. No. 7,256,921 in column 19, line 26 to column 22, line 47, including:
(1) 3-phenyl-3-(4-(4-(3-piperidin-4-yl-propyl)piperidino) phenyl)-13,13-dimethyl-indeno[2',3':3,4]-naphtho[1,2-b] pyran;
(2) 3-phenyl-3-(4-(4-(3-(1-(2-hydroxyethyl)piperidin-4-yl) propyl)piperidino)phenyl)-13,13-dimethyl-indeno[2',3':3, 4]naphtho[1,2-b]pyran;
(3) 3-phenyl-3-(4-(4-(4-butyl-phenylcarbamoyl)-piperidin-1-yl)phenyl)-13,13-dimethyl-6-methoxy-7-(4-phenyl-piperazin-1-yl)indeno[2',3':3,4]naphtho[1,2-b]pyran;
(4) 3-phenyl-3-(4-([1,4]bipiperidinyl-1'-yl)phenyl)-13,13-dimethyl-6-methoxy-7-([1,4']bipiperidinyl-1'-yl)indeno [2',3':3,4]naphtho[1,2-b]pyran;
(5) 3-phenyl-3-(4-(4-phenyl-piperazin-1-yl)phenyl)-13,13-dimethyl-6-methoxy-7-(4-(4-hexylbenzoyloxy)-piperidin-1-yl)indeno[2',3':3,4]naphtho[1,2-b]pyran; and
(6) 3-phenyl-3-(4-(4-phenyl-piperazin-1-yl)phenyl)-13,13-dimethyl-6-methoxy-7-(4-(4'-octyloxy-biphenyl-4-carbonyloxy)-piperidin-1-yl)indeno[2',3':3,4]naphtho[1,2-b] pyran.

More generally, the photochromic-dichroic compounds may comprise: (a) at least one photochromic group (PC) chosen from pyrans, oxazines, and fulgides; and (b) at least one lengthening agent attached to the photochromic group, wherein the lengthening agent (L) is represented by the following Formula I (which is described in detail below):

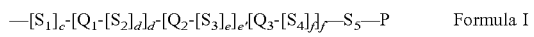

—[S$_1$]$_c$-[Q$_1$-[S$_2$]$_d$]$_{d'}$-[Q$_2$-[S$_3$]$_e$]$_{e'}$-[Q$_3$-[S$_4$]$_f$]$_{f'}$—S$_5$—P      Formula I As used herein, the term "attached" means directly bonded to or indirectly bonded to through another group. Thus, for example, L can be directly bonded to PC as a substituent on PC, or L can be a substituent on another group (such as a group represented by R$^1$, which is discussed below) that is directly bonded to PC (i.e., L is indirectly bonded to PC). Although not limiting herein, L can be attached to PC so as to extend or lengthen PC in an activated state such that the absorption ratio of the extended PC (i.e., the photochromic compound) is enhanced as compared to PC alone. Although not limiting herein, the location of attachment of L on PC may be chosen such that L lengthens PC in at least one of a direction parallel to and a direction perpendicular to a theoretical transitional dipole moment of the activated form of PC. As used herein the term "theoretical transitional dipole moment" refers to transient dipolar polarization created by interaction of electromagnetic radiation with the molecule. See, for example, *IUPAC Compendium of Chemical Technology*, 2$^{nd}$ Ed., International Union of Pure and Applied Chemistry (1997).

With reference to Formula I above, each of Q$_1$, Q$_2$, and Q$_3$ may be independently chosen for each occurrence from: a divalent group chosen from an unsubstituted or a substituted aromatic group, an unsubstituted or a substituted alicyclic group, an unsubstituted or a substituted heterocyclic group, and mixtures thereof, wherein substituents are chosen from: a group represented by P (as set forth below), liquid crystal mesogens, halogen, poly(C$_1$-C$_{18}$ alkoxy), C$_1$-C$_{18}$ alkoxycarbonyl, C$_1$-C$_{18}$ alkylcarbonyl, C$_1$-C$_{18}$ alkoxycarbonyloxy, aryloxycarbonyloxy, perfluoro(C$_1$-C$_{18}$)alkoxy, perfluoro(C$_1$-C$_{18}$)alkoxycarbonyl, perfluoro(C$_1$-C$_{18}$)alkylcarbonyl, perfluoro(C$_1$-C$_{18}$)alkylamino, di-(perfluoro(C$_1$-C$_{18}$)alkyl) amino, perfluoro(C$_1$-C$_{18}$)alkylthio, C$_1$-C$_{18}$ alkylthio, C$_1$-C$_{18}$ acetyl, C$_3$-C$_{10}$ cycloalkyl, C$_3$-C$_{10}$ cycloalkoxy, a straight-chain or branched C$_1$-C$_{18}$ alkyl group that is mono-substituted with cyano, halo, or C$_1$-C$_{18}$ alkoxy, or poly-substituted with halo, and a group represented by one of the following formulae: -M(T)$_{(t-1)}$ and -M(OT)$_{(t-1)}$ wherein M is chosen from aluminum, antimony, tantalum, titanium, zirconium and silicon, T is chosen from organofunctional radicals, organofunctional hydrocarbon radicals, aliphatic hydrocarbon radicals and aromatic hydrocarbon radicals, and t is the valence of M. As used herein, the prefix "poly" means at least two.

As discussed above, Q$_1$, Q$_2$, and Q$_3$ may be independently chosen for each occurrence from a divalent group, such as an unsubstituted or a substituted aromatic group, unsubstituted or substituted heterocyclic group, and an unsubstituted or substituted alicyclic group. Examples of useful aromatic groups include: benzo, naphtho, phenanthro, biphenyl, tetrahydro naphtho, terphenyl, and anthraceno.

As used herein the term "heterocyclic group" means a compound having a ring of atoms, wherein at least one atom forming the ring is different than the other atoms forming the ring. Further, as used herein, the term heterocyclic group specifically excludes fused heterocyclic groups. Examples of suitable heterocyclic groups from which Q$_1$, Q$_2$, and Q$_3$ may be chosen include: isosorbitol, dibenzofuro, dibenzothieno, benzofuro, benzothieno, thieno, furo, dioxino, carbazolo, anthranilyl, azepinyl, benzoxazolyl, diazepinyl, dioazlyl, imidazolidinyl, imidazolyl, imidazolinyl, indazolyl, indoleninyl, indolinyl, indolizinyl, indolyl, indoxazinyl, isobenzazolyl, isoindolyl, isooxazolyl, isooxazyl, isopyrroyl, isoquinolyl, isothiazolyl, morpholino, morpholinyl, oxadiazolyl, oxathiazolyl, oxathiazyl, oxathiolyl, oxatriazolyl, oxazolyl, piperazinyl, piperazyl, piperidyl, purinyl, pyranopyrrolyl, pyrazinyl, pyrazolidinyl, pyrazolinyl, pyrazolyl, pyrazyl, pyridazinyl, pyridazyl, pyridyl, pyrimidinyl, pyrimidyl, pyridenyl, pyrrolidinyl, pyrrolinyl, pyrroyl, quinolizinyl, quinuclidinyl, quinolyl, thiazolyl, triazolyl, triazyl, N-arylpiperazino, aziridino, arylpiperidino, thiomorpholino, tetrahydroquinolino, tetrahydroisoquinolino, pyrryl, unsubstituted, mono- or di-substituted C$_4$-C$_{18}$ spirobicyclic amines, and unsubstituted, mono- or di-substituted C$_4$-C$_{18}$ spirotricyclic amines.

As discussed above, $Q_1$, $Q_2$, and $Q_3$ may be chosen from mono- or di-substituted $C_4$-$C_{18}$ spirobicyclic amine and $C_4$-$C_{18}$ spirotricyclic amine. examples of suitable substituents include aryl, $C_1$-$C_6$ alkyl, $C_1$-$C_6$ alkoxy or phenyl ($C_1$-$C_6$)alkyl. Specific examples of mono- or di-substituted spirobicyclic amines include: 2-azabicyclo[2.2.1]hept-2-yl; 3-azabicyclo[3.2.1]oct-3-yl; 2-azabicyclo[2.2.2]oct-2-yl; and 6-azabicyclo[3.2.2]nonan-6-yl. Specific examples of mono- or di-substituted tricyclic amines include: 2-azatricyclo[3.3.1.1 (3,7)]decan-2-yl; 4-benzyl-2-azatricyclo[3.3.1.1 (3,7)]decan-2-yl; 4-methoxy-6-methyl-2-azatricyclo[3.3.1.1 (3,7)]decan-2-yl; 4-azatricyclo[4.3.1.1(3,8)]undecan-4-yl; and 7-methyl-4-azatricyclo[4.3.1.1 (3,8)]undecan-4-yl. Examples of alicyclic groups from which $Q_1$, $Q_2$, and $Q_3$ may be chosen include, without limitation, cyclohexyl, cyclopropyl, norbornenyl, decalinyl, adamantanyl, bicycloctane, per-hydrofluorene, and cubanyl.

With continued reference to Formula I, each $S_1$, $S_2$, $S_3$, $S_4$, and $S_5$ can be independently chosen for each occurrence from a spacer unit chosen from:

(1) —$(CH_2)_g$—, —$(CF_2)_h$—, —$Si(CH_2)_g$—, —$(Si[(CH_3)_2]O)_h$—, wherein g is independently chosen for each occurrence from 1 to 20; h is chosen from 1 to 16;

(2) —N(Z)—, —C(Z)=C(Z)—, —C(Z)=N—, —C(Z')—C(Z')— or a single bond, wherein Z is independently chosen for each occurrence from hydrogen, $C_1$-$C_{18}$ alkyl, $C_3$-$C_{10}$ cycloalkyl and aryl, and Z' is independently chosen for each occurrence from $C_1$-$C_{18}$ alkyl, $C_3$-$C_{10}$cycloalkyl and aryl; and (3) —O—, —C(O)—, —C≡—, —N=N—, —S—, —S(O)—, —S(O)(O)—, —(O)S(O)O—, —O(O)S(O)O— or straight-chain or branched $C_1$-$C_{24}$ alkylene residue, said $C_1$-$C_{24}$ alkylene residue being unsubstituted, mono-substituted by cyano or halo, or poly-substituted by halo; provided that when two spacer units comprising heteroatoms are linked together the spacer units are linked so that heteroatoms are not directly linked to each other and when Si and $S_5$ are linked to PC and P, respectively, they are linked so that two heteroatoms are not directly linked to each other. As used herein the term "heteroatom" means atoms other than carbon or hydrogen.

Further, in Formula I, c, d, e, and f each may be independently chosen from an integer ranging from 1 to 20, inclusive; and d', e' and f' each may be independently chosen from 0, 1, 2, 3, and 4, provided that the sum of d'+e'+f' is at least 1. According to the present invention, c, d, e, and f each may be independently chosen from an integer ranging from 1 to 20, inclusive; and d', e' and f each may be independently chosen from 0, 1, 2, 3, and 4, provided that the sum of d'+e'+f' is at least 2. According to the present invention, c, d, e, and f each may be independently chosen from an integer ranging from 1 to 20, inclusive; and d', e' and f' each may be independently chosen from 0, 1, 2, 3, and 4, provided that the sum of d'+e'+f' is at least 3. According to the present invention, c, d, e, and f each may be independently chosen from an integer ranging from 1 to 20, inclusive; and d', e' and f' each may be independently chosen from 0, 1, 2, 3, and 4, provided that the sum of d'+e'+f' is at least 1.

Further, in Formula I, P can be chosen from: hydroxy, amino, $C_2$-$C_{18}$ alkenyl, $C_2$-$C_{18}$ alkynyl, azido, silyl, siloxy, silylhydride, (tetrahydro-2H-pyran-2-yl)oxy, thio, isocyanato, thioisocyanato, acryloyloxy, methacryloyloxy, 2-(acryloyloxy)ethylcarbamyl, 2-(methacryloyloxy)ethylcarbamyl, aziridinyl, allyloxycarbonyloxy, epoxy, carboxylic acid, carboxylic ester, acryloylamino, methacryloylamino, aminocarbonyl, $C_1$-$C_{18}$ alkyl aminocarbonyl, aminocarbonyl($C_1$-$C_{18}$) alkyl, $C_1$-$C_{18}$ alkyloxycarbonyloxy, halocarbonyl, hydrogen, aryl, hydroxy($C_1$-$C_{18}$)alkyl, $C_1$-$C_{18}$ alkyl, $C_1$-$C_{18}$ alkoxy, amino($C_1$-$C_{18}$)alkyl, $C_1$-$C_{18}$ alkylamino, di-($C_1$-$C_{18}$)alkylamino, $C_1$-$C_{18}$ alkyl($C_1$-$C_{18}$)alkoxy, $C_1$-$C_{18}$ alkoxy($C_1$-$C_{18}$)alkoxy, nitro, poly($C_1$-$C_{18}$)alkyl ether, ($C_1$-$C_{18}$)alkyl($C_1$-$C_{18}$)alkoxy($C_1$-$C_{18}$)alkyl, polyethyleneoxy, polypropyleneoxy, ethylenyl, acryloyl, acryloyloxy($C_1$-$C_{18}$) alkyl, methacryloyl, methacryloyloxy($C_1$-$C_{18}$)alkyl, 2-chloroacryloyl, 2-phenylacryloyl, acryloyloxyphenyl, 2-chloroacryloylamino, 2-phenylacryloylaminocarbonyl, oxetanyl, glycidyl, cyano, isocyanato($C_1$-$C_{18}$)alkyl, itaconic acid ester, vinyl ether, vinyl ester, a styrene derivative, main-chain and side-chain liquid crystal polymers, siloxane derivatives, ethyleneimine derivatives, maleic acid derivatives, fumaric acid derivatives, unsubstituted cinnamic acid derivatives, cinnamic acid derivatives that are substituted with at least one of methyl, methoxy, cyano and halogen, or substituted or unsubstituted chiral or non-chiral monovalent or divalent groups chosen from steroid radicals, terpenoid radicals, alkaloid radicals and mixtures thereof, wherein the substituents are independently chosen from $C_1$-$C_{18}$ alkyl, $C_1$-$C_{18}$ alkoxy, amino, $C_3$-$C_{10}$cycloalkyl, $C_1$-$C_{18}$ alkyl($C_1$-$C_{18}$)alkoxy, fluoro($C_1$-$C_{18}$)alkyl, cyano, cyano($C_1$-$C_{18}$)alkyl, cyano($C_1$-$C_{18}$)alkoxy or mixtures thereof, or P is a structure having from 2 to 4 reactive groups or P is an unsubstituted or substituted ring opening metathesis polymerization precursor.

Further, although not limiting herein, when P is a polymerizable group, the polymerizable group may be any functional group adapted to participate in a polymerization reaction. Examples of polymerization reactions include those described in the definition of "polymerization" in *Hawley's Condensed Chemical Dictionary Thirteenth Edition*, 1997, John Wiley & Sons, pages 901-902, which disclosure is incorporated herein by reference. For example, although not limiting herein, polymerization reactions include: "addition polymerization," in which free radicals are the initiating agents that react with the double bond of a monomer by adding to it on one side at the same time producing a new free electron on the other side; "condensation polymerization," in which two reacting molecules combine to form a larger molecule with elimination of a small molecule, such as a water molecule; and "oxidative coupling polymerization." Further, examples of polymerizable groups include hydroxy, acryloxy, methacryloxy, 2-(acryloxy)ethylcarbamyl, 2-(methacryloxy)ethylcarbamyl, isocyanate, aziridine, allylcarbonate, and epoxy, e.g., oxiranylmethyl.

Moreover, P may be chosen from a main-chain or a side-chain liquid crystal polymer and a liquid crystal mesogen. As used herein, the term liquid crystal "mesogen" means rigid rod-like or disc-like liquid crystal molecules. Further, as used herein the term "main-chain liquid crystal polymer" refers to a polymer having liquid crystal mesogens within the backbone (i.e., the main chain) structure of the polymer. As used herein the term "side-chain liquid crystal polymer" refers to a polymer having liquid crystal mesogens attached to the polymer at the side chains. Although not limiting herein, generally, the mesogens are made up of two or more aromatic rings that restrict the movement of a liquid crystal polymer. Examples of suitable rod-like liquid crystal mesogens include without limitation: substituted or unsubstituted aromatic esters, substituted or unsubstituted linear aromatic compounds, and substituted or unsubstituted terphenyls. According to the present invention, P may be chosen from a steroid, for example and without limitation, a cholesterolic compound.

Examples of thermally reversible photochromic pyrans from which the photochromic group PC can be chosen include benzopyrans, naphthopyrans, e.g., naphtho[1,2-b]pyrans, naphtho[2,1-b]pyrans, indeno-fused naphthopyrans, such as those disclosed in U.S. Pat. No. 5,645,767, and heterocyclic-fused naphthopyrans, such as those disclosed in U.S. Pat. Nos. 5,723,072, 5,698,141, 6,153,126, and 6,022,497, which are hereby incorporated by reference; spiro-9-fluoreno[1,2-b]pyrans; phenanthropyrans; quinopyrans; fluoroanthenopyrans; spiropyrans, e.g., spiro(benzindoline) naphthopyrans, spiro(indoline)benzopyrans, spiro(indoline) naphthopyrans, spiro(indoline)quinopyrans and spiro(indoline)pyrans. More specific examples of naphthopyrans and the complementary organic photochromic substances are described in U.S. Pat. No. 5,658,501, which are hereby specifically incorporated by reference herein. Spiro(indoline)pyrans are also described in the text, Techniques in Chemistry, Volume III, "Photochromism", Chapter 3, Glenn H. Brown, Editor, John Wiley and Sons, Inc., New York, 1971, which is hereby incorporated by reference.

Examples of photochromic oxazines from which PC can be chosen include benzoxazines, naphthoxazines, and spirooxazines, e.g., spiro(indoline)naphthoxazines, spiro(indoline)pyridobenzoxazines, spiro(benzindoline)pyridobenzoxazines, spiro(benzindoline)naphthoxazines, spiro(indoline) benzoxazines, spiro(indoline)fluoranthenoxazine, and spiro (indoline)quinoxazine. Examples of photochromic fulgides from which PC can be chosen include: fulgimides, and the 3-furyl and 3-thienyl fulgides and fulgimides, which are disclosed in U.S. Pat. No. 4,931,220 (which are hereby specifically incorporated by reference) and mixtures of any of the aforementioned photochromic materials/compounds.

Further, wherein the photochromic-dichroic compound comprises at least two PCs, the PCs can be linked to one another via linking group substituents on the individual PCs. For example, the PCs can be polymerizable photochromic groups or photochromic groups that are adapted to be compatible with a host material ("compatibilized photochromic group"). Examples of polymerizable photochromic groups from which PC may be chosen include those disclosed in U.S. Pat. No. 6,113,814, which is hereby specifically incorporated by reference herein. Examples of compatibilized photochromic groups from which PC may be chosen include those disclosed in U.S. Pat. No. 6,555,028, which is hereby specifically incorporated by reference herein.

Other suitable photochromic groups and complementary photochromic groups are described in U.S. Pat. No. 6,080,338 at column 2, line 21 to column 14, line 43; 6,136,968 at column 2, line 43 to column 20, line 67; 6,296,785 at column 2, line 47 to column 31, line 5; 6,348,604 at column 3, line 26 to column 17, line 15; 6,353,102 at column 1, line 62 to column 11, line 64; and 6,630,597 at column 2, line 16 to column 16, line 23; the disclosures of the aforementioned patents are incorporated herein by reference.

In addition to at least one lengthening agent (L), the photochromic compounds may further comprise at least one group represented by $R^1$ that is directly bonded to PC. Although not required, as previously discussed, the at least one lengthening agent (L) can be indirectly bonded to PC through the at least one group represented by R'. That is, L may be a substituent on at least one group $R^1$ that is bonded to PC. According to the present invention, $R^1$ may be independently chosen for each occurrence from substituents disclosed in U.S. Pat. No. 7,256,921 from column 26, line 60 to column 30, line 64. The photochromic-dichroic compounds of the present invention include the compounds and methods of preparation disclosed in U.S. Pat. No. 7,256,921 from column 30, line 65 to column 66, line 60, the cited portion of which is incorporated herein by reference.

Further, as discussed below in more detail, the photochromic-dichroic compound may be at least partially aligned.

According to the present invention, the photochromic-dichroic compound of the present invention may comprise a plurality of photochromic-dichroic compounds. Although not limiting herein, when two or more photochromic-dichroic compounds are used in combination, the photochromic-dichroic compounds may be chosen to complement one another to produce a desired color or hue. For example, mixtures photochromic-dichroic compounds may be used to attain certain activated colors, such as a near neutral gray or near neutral brown. See, for example, U.S. Pat. No. 5,645,767, column 12, line 66 to column 13, line 19, the disclosure of which is specifically incorporated by reference herein, which describes the parameters that define neutral gray and brown colors. Additionally, or alternatively, the photochromic-dichroic compound may comprise mixtures of photochromic-dichroic compounds having complementary linear polarization states. For example, the photochromic-dichroic compounds may be chosen to have complementary linear polarization states over a desired range of wavelengths to produce a display element that is capable of polarizing light over the desired range of wavelengths. Still further, mixtures of complementary photochromic-dichroic compounds having essentially the same polarization states at the same wavelengths may be chosen to reinforce or enhance the overall linear polarization achieved. For example, the photochromic-dichroic compound may comprise at least two at least partially aligned photochromic-dichroic compounds, wherein the photochromic-dichroic compounds have complementary colors and/or complementary linear polarization states.

According to the present invention, the display element comprises a dichroic compound. As used herein the term "dichroic" means capable of absorbing one of two orthogonal plane polarized components of transmitted radiation more strongly than the other. In contrast to photochromic-dichroic compound, the dichroic compound has a fixed absorption state and a fixed degree of linear polarization that does not vary in response to exposure to actinic radiation. According to the present invention, the dichroic compound may comprise a plurality of dichroic compounds. Additionally, as discussed below in more detail, the dichroic compound may be at least partially aligned.

The dichroic compound may comprise azomethines, indigoids, thioindigoids, merocyanines, indans, quinophthalonic dyes, perylenes, phthaloperines, triphenodioxazines, indoloquinoxalines, imidazo-triazines, tetrazines, azo and (poly)azo dyes, benzoquinones, naphthoquinones, anthroquinone and (poly)anthroquinones, anthropyrimidinones, iodine and iodates. The dichroic compound may be a polymerizable dichroic compound. That is, the dichroic compound may comprise at least one group that is capable of being polymerized (i.e., a "polymerizable group"). For example, although not limiting herein, the dichroic compound may comprise at least one alkoxy, polyalkoxy, alkyl, or polyalkyl substituent terminated with at least one polymerizable group. The dichroic compound may also comprise a plurality of these compounds.

Suitable commercially available anthroquinone dyes include blue colored dyes Blue AB2, Blue AB3 and Blue AB4, the yellow colored dye Yellow AG1, the orange colored dye Orange AO1, the red colored dye Red AR1, and the cyan colored dye Cyan AC1, each of which is available from Nematel GmbH & Co. KG. Suitable commercially available azo dyes include the orange colored dye Orange AZO1, available from Nematel GmbH & Co. KG.

As discussed above, the display element of the present invention has a first absorption state and a second absorption state and is operable for switching from the first absorption state to the second absorption state in response to actinic radiation and to revert back to the first absorption state in response to actinic radiation and/or thermal energy. According to the present invention, as used herein to modify the term "state," the terms "first" and "second" are not intended to refer to any particular order or chronology, but instead refer to two different conditions or properties. For example, although not limiting herein, the first state and the second state of the display element may differ with respect to at least one optical property, such as, but not limited to, the absorption/transmittance or linear polarization of visible and/or UV radiation. Thus, the display element may be adapted to have a different absorption spectrum in each of the first and second states. For example, while not limiting herein, the display element can be adapted to have a first color in the first state and a second color in the second state. Further, the display element may be adapted to have a first level of transmittance in the first state and a reduced level of transmittance in the second state.

The properties of the first absorption state of the display element are generally dictated by the dichroic compound. Although the photochromic-dichroic compound present in the display element may linearly polarize transmitted radiation in the first absorption state, any amount of linear polarization provided by the photochromic-dichroic compound will be complementary to the more powerful absorption/linear polarization provided by the dichroic compound in the first absorption state. In contrast, the properties of the second absorption state of the display element are generally dictated by the photochromic-dichroic compound and complemented by the dichroic compound. Upon activation of the photochromic-dichroic compound to achieve the second absorption state of the display element, the absorption/linear polarization provided by the photochromic-dichroic compound is more powerful than the dichroic compound.

The first absorption state may have a transmittance percentage (% T) of at least 50%, such as at least 55%, such as at least 60%, and may have a transmittance percentage of no more than 80%, such as no more than 75%, such as no more than 70%. The first absorption state may have a transmittance percentage of 50% to 80%, such as 55% to 75%, such as 60% to 70%.

The second absorption state may have a transmittance percentage of at least 10%, such as at least 12%, such as at least 15%, and may have a transmittance percentage of no more than 50%, such as no more than 45%, such as no more than 40%. The second absorption state may have a transmittance percentage of 10% to 50%, such as 12% to 45%, such as 15% to 40%.

As used herein, the terms "transmittance percentage" and "% T" refers to photopic transmission, and specifically refers to the fraction of incident electromagnetic power in the visible spectrum (wavelength of 390 nm to 700 nm) that is transmitted through a body, such as the display element, multiplied by 100%. The transmittance percentage may be measured by passing light through a body, recording the intensity using a spectrophotometer, dividing that value by the intensity of light when passed through a blank (i.e., no body) as measured by the spectrophotometer, and multiplying that value by 100%. The transmittance percentage, % T, may be represented by the following Equation 1:

$$\% T = P/P_0 * 100\% \tag{Eq. 1}$$

wherein P is intensity of light after passing through the body and $P_0$ is the intensity of light when passing through the blank. The Examples provide methods for measuring the transmission percentage.

The first absorption state may have a linear polarization efficiency of at least 5%, such as at least 10%, such as at least 15%, and may have a linear polarization efficiency of no more than 70%, such as no more than 60%, such as no more than 50%. The first absorption state may have a linear polarization efficiency of 5% to 70%, such as 10% to 60%, such as 15% to 50%.

The second absorption state may have a linear polarization efficiency of at least 55%, such as at least 65%, such as at least 70%, and may have a linear polarization efficiency of no more than 99.9%, such as no more than 90%, such as no more than 80%. The second absorption state may have a linear polarization efficiency of 55% to 99.9%, such as 65% to 90%, such as 70% to 80%.

As used herein, the term "linear polarization efficiency" refers to the percentage of incident electromagnetic radiation a body, such as the display element, transmits in the intended polarization state. For example, a body having a linear polarization efficiency of 99% transmits 99% of incident electromagnetic radiation in the intended polarization state (e.g., p- or s-polarization) and 1% of incident electromagnetic radiation in the opposite polarization state.

The weight ratio of dichroic compound to photochromic-dichroic compound may be at least 0.005:1, such as at least 0.010:1, such as at least 0.015:1, and may be no more than 0.150:1, such as no more than 0.120:1, such as no more than 0.090:1. The weight ratio of dichroic compound to photochromic-dichroic compound may be 0.005:1 to 0.150:1, such as 0.010:1 to 0.120:1, such as 0.015:1 to 0.090:1.

According to the present invention, the display element may comprise a substrate, a sheet, a coating, or any combination thereof. The display element may comprise a single substrate or sheet comprising a photochromic-dichroic compound and a dichroic compound. The display element may also comprise at least one substrate and/or at least one sheet, wherein the substrate or at least one sheet optionally includes at least one coating, and at least one of the substrate(s), sheet(s) and/or coating(s), if present, comprises a photochromic-dichroic compound and at least one of the substrate(s), sheet(s) and/or coating(s), if present, comprises a dichroic compound. Any of the substrate(s), sheet(s) and/or coating(s) of the display element may comprise a photochromic-dichroic compound, a dichroic compound, or both a photochromic-dichroic compound and a dichroic compound. Additionally, multiple substrates, sheets and/or coatings of the display element may comprise a photochromic-dichroic compound, a dichroic compound, or combinations thereof. Further, the display element may comprise other layers that do not contain a photochromic-dichroic compound or a dichroic compound. Generally, substrates, sheets and coatings may each individually be referred to as a "layer."

Accordingly, the display element may comprise a substrate comprising the photochromic-dichroic compound and the dichroic compound. The display element may also comprise at least one sheet connected to a substrate, wherein at least one of the substrate and/or sheet(s) comprises at least one of the photochromic-dichroic compound and/or the dichroic compound. The display element may comprise at least one coating on a substrate, wherein at least one of the substrate and/or coating(s) comprises at least one of the photochromic-dichroic compound and/or the dichroic compound. The display element may comprise substrate connected to at least one sheet, further comprising at least one coating on at least one of the substrate and/or sheet(s), wherein at least one of the substrate, sheet(s) and/or coating (s) comprise at least one of the photochromic-dichroic compound and/or the dichroic compound. Additionally, any of the display elements described in this paragraph may comprise more than one substrate.

The display element may comprise a sheet comprising the photochromic-dichroic compound and the dichroic compound. The display element may comprise multiple sheets, wherein at least one of the sheets comprises the photochromic-dichroic compound and the dichroic compound. The display element may comprise at least one sheet further comprising at least one coating on at least one sheet, wherein at least one of the sheet(s) and/or coating(s) comprise the photochromic-dichroic compound and the dichroic compound.

As used herein, the term "sheet" refers to a pre-formed film having a generally uniform thickness and is capable of self-support. Examples of polymeric sheets that may be used in the display element include, without limitation, stretched polymer sheets, ordered liquid crystal polymer sheets, and photo-oriented polymer sheets. Examples of polymeric materials, other than liquid crystal materials and photo-orientation materials that may be used in forming polymeric sheets include without limitation, polyvinyl alcohol, polyvinyl chloride, polyurethane, polyacrylate, and polycaprolactam.

As used herein, the term "coating" means a supported film derived from a flowable composition, which may or may not have a uniform thickness, and specifically excludes polymeric sheets. The coating may comprise an at least partially ordered anisotropic material. As used herein the term "anisotropic" means having at least one property that differs in value when measured in at least one different direction. Thus, "anisotropic materials" are materials that have at least one property that differs in value when measured in at least one different direction. Examples of anisotropic materials that are suitable for use in the present invention include, without limitation, liquid crystal material.

Further, as used herein the terms "connected to" or "on" means in direct contact with an object or indirect contact with an object through one or more other structures or materials, at least one of which is in direct contact with the object. Thus, the coating or sheet may be in direct contact with at least a portion of the substrate or it may be in indirect contact with at least a portion of the substrate through one or more other structures or materials. For example, although not limiting herein, the coating or sheet may be in contact with one or more other at least partial coatings, polymer sheets or combinations thereof, at least one of which is in direct contact with at least a portion of the substrate.

Substrates that are suitable for use in the display element include, but are not limited to, substrates formed from organic materials, inorganic materials, or combinations thereof (for example, composite materials). Non-limiting examples of substrates are described in more detail below.

Specific examples of organic materials that may be used to form the substrates disclosed herein include polymeric materials, for example, homopolymers and copolymers, prepared from the monomers and mixtures of monomers disclosed in U.S. Pat. No. 5,962,617 and in U.S. Pat. No. 5,658,501 from column 15, line 28 to column 16, line 17, the disclosures of which U.S. patents are specifically incorporated herein by reference. For example, such polymeric materials may be thermoplastic or thermoset polymeric materials, may be transparent or optically clear, and may have any refractive index required. Examples of such disclosed monomers and polymers include: polyol(allyl carbonate) monomers, e.g., allyl diglycol carbonates such as diethylene glycol bis(allyl carbonate), which monomer is sold under the trademark CR-39 by PPG Industries, Inc.; polyurea-polyurethane (polyurea-urethane) polymers, which are prepared, for example, by the reaction of a polyurethane prepolymer and a diamine curing agent, a composition for one such polymer being sold under the trademark TRIVEX by PPG Industries, Inc.; polyol(meth) acryloyl terminated carbonate monomer; diethylene glycol dimethacrylate monomers; ethoxylated phenol methacrylate monomers; diisopropenyl benzene monomers; ethoxylated trimethylol propane triacrylate monomers; ethylene glycol bismethacrylate monomers; poly(ethylene glycol) bismethacrylate monomers; urethane acrylate monomers; poly (ethoxylated bisphenol A dimethacrylate); poly(vinyl acetate); poly(vinyl alcohol); poly(vinyl chloride); poly(vinylidene chloride); polyethylene; polypropylene; polyurethanes; polythiourethanes; thermoplastic polycarbonates, such as the carbonate-linked resin derived from bisphenol A and phosgene, one such material being sold under the trademark LEXAN; polyesters, such as the material sold under the trademark MYLAR; poly(ethylene terephthalate); polyvinyl butyral; poly(methyl methacrylate), such as the material sold under the trademark PLEXIGLAS, and polymers prepared by reacting polyfunctional isocyanates with polythiols or polyepisulfide monomers, either homopolymerized or co- and/or terpolymerized with polythiols, polyisocyanates, polyisothiocyanates and optionally ethylenically unsaturated monomers or halogenated aromatic-containing vinyl monomers. Also contemplated are copolymers of such monomers and blends of the described polymers and copolymers with other polymers, for example, to form block copolymers or interpenetrating network products.

Other examples of organic materials suitable for use in forming the substrates include both synthetic and natural organic materials, including without limitation: opaque or translucent polymeric materials, natural and synthetic textiles, and cellulosic materials such as, paper and wood.

Examples of inorganic materials suitable for use in forming the substrates include glasses, minerals, ceramics, and metals. For example, the substrate may comprise glass. The substrate may have a reflective surface, for example, a polished ceramic substrate, metal substrate, or mineral substrate. The substrate may comprise a reflective coating or layer deposited or otherwise applied to a surface of an inorganic or an organic substrate to make it reflective or to enhance its reflectivity.

Further, the substrates may have a protective coating, such as, but not limited to, an abrasion-resistant coating, such as a "hard coat," on their exterior surfaces.

Still further, the substrates may optionally be untinted, tinted, linearly polarizing, circularly polarizing, elliptically polarizing, photochromic, or tinted-photochromic substrates. For example, as discussed above, the substrate may comprise the photochromic-dichroic compound and/or the dichroic compound, and, accordingly, will be linearly polarizing in the first state and/or second state. As used herein with reference to substrates, the term "untinted" means substrates that are essentially free of coloring agent additions (such as, but not limited to, conventional dyes) and have an absorption spectrum for visible radiation that does not vary significantly in response to actinic radiation. Further, with reference to substrates, the term "tinted" means substrates that have a coloring agent addition (such as, but not limited to, conventional dyes) and an absorption spectrum for visible radiation that does not vary significantly in response to actinic radiation.

As used herein the term "linearly polarizing" with reference to substrates refers to substrates that are adapted to linearly polarize radiation. As used herein the term "circularly polarizing" with reference to substrates refers to substrates that are adapted to circularly polarize radiation. As used herein the term "elliptically polarizing" with reference to substrates refers to substrates that are adapted to elliptically polarize radiation. As used herein with the term "photochromic" with reference to substrates refers to substrates having an absorption spectrum for visible radiation that varies in response to at least actinic radiation. Further, as used herein with reference to substrates, the term "tinted-photochromic" means substrates containing a coloring agent addition as well as a photochromic material, and having an absorption spectrum for visible radiation that varies in response to at least actinic radiation. Thus, for example and without limitation, the tinted-photochromic substrate can have a first color characteristic of the coloring agent and a second color characteristic of the combination of the coloring agent the photochromic material when exposed to actinic radiation.

As previously discussed, while the photochromic-dichroic compound and the dichroic compound may be linearly polarizing in the first and/or second state, it is generally necessary to suitably position or arrange the molecules of photochromic-dichroic compound or dichroic compound in order to achieve a net linear polarization effect resulting from the photochromic-dichroic compound or the dichroic compound. Therefore, as discussed above, the photochromic-dichroic compound may be at least partially aligned, and the dichroic compound may be at least partially aligned. The dichroic compound may optionally be at least partially aligned with the photochromic-dichroic compound, or the compounds may be aligned independently.

According to the present invention, the display element may comprise at least one at least partially ordered alignment layer. The alignment layer may at least partially align or order the photochromic-dichroic compound and/or the dichroic compound. As used herein, the terms "align" or "aligned" mean to bring into suitable arrangement or position by interaction with another material, compound or structure. For example, the portion of the partially aligned photochromic-dichroic compound and/or dichroic compound that is at least partially aligned by interaction with the alignment layer may be at least partially aligned such that the long-axis of the photochromic-dichroic compound in the activated state and/or dichroic compound is essentially parallel to the first general direction of the alignment layer. Additionally, the portion of the partially aligned photochromic-dichroic compound and/or dichroic compound that is at least partially aligned by interaction with a portion of the alignment layer may be bound to or reacted with the portion of the alignment layer. As used herein with reference to order or alignment of a material or structure, the term "general direction" refers to the predominant arrangement or orientation of the material, compound or structure. Further, it will be appreciated by those skilled in the art that a material, compound or structure may have a general direction even though there is some variation within the arrangement of the material, compound or structure, provided that the material, compound or structure has at least one predominate arrangement.

Examples of alignment layers include at least partial coatings comprising an at least partially ordered alignment medium, at least partially ordered polymer sheets, at least partially treated surfaces, Langmuir-Blodgett films, and combinations thereof.

The alignment layer may comprise a coating comprising an at least partially ordered alignment medium. Examples of suitable alignment media that may be used include photo-orientation materials, rubbed-orientation materials, and liquid crystal materials. Methods of ordering at least a portion of the alignment medium are described herein below in detail.

As discussed above, the alignment medium may be a liquid crystal material. Liquid crystal materials, because of their structure, are generally capable of being ordered or aligned so as to take on a general direction. More specifically, because liquid crystal molecules have rod- or disc-like structures, a rigid long axis, and strong dipoles, liquid crystal molecules can be ordered or aligned by interaction with an external force or another structure such that the long axis of the molecules takes on an orientation that is generally parallel to a common axis. For example, the molecules of a liquid crystal material may be aligned by using a magnetic field, an electric field, linearly polarized infrared radiation, linearly polarized ultraviolet radiation, linearly polarized visible radiation, or shear forces. It is also possible to align liquid crystal molecules with an oriented surface. That is, liquid crystal molecules may be applied to a surface that has been oriented, for example by rubbing, grooving, or photo-alignment methods, and subsequently aligned such that the long axis of each of the liquid crystal molecules takes on an orientation that is generally parallel to the general direction of orientation of the surface. Examples of liquid crystal materials suitable for use as alignment media include liquid crystal polymers, liquid crystal pre-polymers, liquid crystal monomers, and liquid crystal mesogens. As used herein the term "pre-polymer" means partially polymerized materials.

Liquid crystal monomers that are suitable for use in the present invention include mono—as well as multi-functional liquid crystal monomers. Further, the liquid crystal monomer may be a cross-linkable liquid crystal monomer, and may further be a photocross-linkable liquid crystal monomer. As used herein the term "photocross-linkable" means a material, such as a monomer, a pre-polymer or a polymer that can be cross-linked on exposure to actinic radiation. For example, photocross-linkable liquid crystal monomers include those liquid crystal monomers that are cross-linkable on exposure to ultraviolet radiation and/or visible radiation, either with or without the use of polymerization initiators.

Examples of cross-linkable liquid crystal monomers suitable for use in the present invention include liquid crystal monomers having functional groups chosen from acrylates, methacrylates, allyl, allyl ethers, alkynes, amino, anhydrides, epoxides, hydroxides, isocyanates, blocked isocyanates, siloxanes, thiocyanates, thiols, urea, vinyl, vinyl ethers and blends thereof. Examples of photocross-linkable liquid crystal monomers suitable for use in the coatings of the alignment layer include liquid crystal monomers having functional groups chosen from acrylates, methacrylates, alkynes, epoxides, thiols, and blends thereof.

Liquid crystal polymers and pre-polymers that are suitable for use in the present invention include main-chain liquid crystal polymers and pre-polymers and side-chain liquid crystal polymers and pre-polymers. In main-chain liquid crystal polymers and pre-polymers, rod- or disc-like liquid crystal mesogens are primarily located within the polymer backbone. In side-chain polymers and pre-polymers, the rod- or disc-like liquid crystal mesogens primarily are located within the side chains of the polymer. Additionally, the liquid crystal polymer or pre-polymer may be cross-linkable, and further may be photocross-linkable.

Examples of liquid crystal polymers and pre-polymers that are suitable for use in the present invention include, but are not limited to, main-chain and side-chain polymers and pre-polymers having functional groups chosen from acrylates, methacrylates, allyl, allyl ethers, alkynes, amino, anhydrides, epoxides, hydroxides, isocyanates, blocked isocyanates, siloxanes, thiocyanates, thiols, urea, vinyl, vinyl ethers, and blends thereof. Examples of photocross-linkable liquid crystal polymers and pre-polymers that are suitable for use in the coatings of the alignment layer include those polymers and pre-polymers having functional groups chosen from acrylates, methacrylates, alkynes, epoxides, thiols, and blends thereof.

Liquid crystals mesogens that are suitable for use in the present invention include thermotropic liquid crystal mesogens and lyotropic liquid crystal mesogens. Further, examples of liquid crystal mesogens that are suitable for use in the present invention include columatic (or rod-like) liquid crystal mesogens and discotic (or disc-like) liquid crystal mesogens.

Examples of photo-orientation materials that are suitable for use as an alignment medium include photo-orientable polymer networks. Specific examples of suitable photo-orientable polymer networks include azobenzene derivatives, cinnamic acid derivatives, coumarine derivatives, ferulic acid derivatives, and polyimides. For example, the alignment layer may comprise at least one at least partial coating comprising an at least partially ordered photo-orientable polymer network chosen from azobenzene derivatives, cinnamic acid derivatives, coumarine derivatives, ferulic acid derivatives, and polyimides. Specific examples of cinnamic acid derivatives that may be used as an alignment medium include polyvinyl cinnamate and polyvinyl esters of paramethoxycinnamic acid.

As used herein the term "rubbed-orientation material" means a material that can be at least partially ordered by rubbing at least a portion of a surface of the material with another suitably textured material. For example, although not limiting herein, the rubbed-orientation material can be rubbed with a suitably textured cloth or a velvet brush. Examples of rubbed-orientation materials that are suitable for use as an alignment medium include (poly)imides, (poly)siloxanes, (poly)acrylates, and (poly)coumarines. Thus, for example, although not limiting herein, the coating comprising the alignment medium may be a coating comprising a polyimide that has been rubbed with velvet or a cloth so as to at least partially order at least a portion of the surface of the polyimide.

As discussed above, the at least partially ordered alignment layer may comprise an at least partially ordered polymer sheet. For example, although not limiting herein, a sheet of polyvinyl alcohol can be at least partially ordered by stretching the sheet, and thereafter the sheet can be bonded to the at least a portion a surface of a substrate to form the alignment layer. Alternatively, the ordered polymer sheet may be made by a method that at least partially orders the polymer chains during fabrication, for example and without limitation, by extrusion. Further, the at least partially ordered polymer sheet can be formed by casting or otherwise forming a sheet of a liquid crystal material and thereafter at least partially ordering the sheet for example, but exposing the sheet to at least one of a magnetic field, an electric field, or a shear force. Still further, the at least partially ordered polymer sheet can be made using photo-orientation methods. For example, and without limitation, a sheet of a photo-orientation material can be formed, for example by casting, and thereafter at least partially ordered by exposure to linearly polarized ultraviolet radiation. Still other methods of forming at least partially ordered polymer sheets are described herein below.

Still further, the alignment layer may comprise an at least partially treated surface. As used herein, the term "treated surface" refers to at least a portion of a surface that has been physically altered to create at least one ordered region on at least a portion of the surface. Examples of at least partially treated surfaces include at least partially rubbed surfaces, at least partially etched surfaces, and at least partially embossed surfaces. Further, the at least partially treated surfaces can be patterned, for example using a photolithographic or an interferographic process. Examples of at least partially treated surfaces include chemically etched surfaces, plasma etched surfaces, nanoetched surfaces (such as surfaces etched using a scanning tunneling microscope or an atomic force microscope), laser etched surfaces, and electron-beam etched surfaces.

The alignment layer may also comprise an at least partially treated surface formed by depositing a metal salt (such as a metal oxide or metal fluoride) onto at least a portion of a surface, and thereafter etching the deposit to form an at least partially treated surface. Examples of suitable techniques for depositing a metal salt include plasma vapor deposition, chemical vapor deposition, and sputtering. Examples of etching processes are set forth above.

As used herein the term "Langmuir-Blodgett films" means one or more at least partially ordered molecular films on a surface. For example, although not limiting herein, a Langmuir-Blodgett film may be formed by dipping a substrate into a liquid one or more times so that it is at least partially covered by a molecular film and then removing the substrate from the liquid such that, due to the relative surface tensions of the liquid and the substrate, the molecules of the molecular film are at least partially ordered in a general direction. As used herein, the term molecular film refers to monomolecular films (i.e., monolayers) as well as films comprising more than one monolayer.

Additionally, the sheet and/or coating may further comprise at least one additive that may facilitate one or more of the processing, the properties, or the performance of the film or coating. Examples of such additives include dyes, alignment promoters, kinetic enhancing additives, photoinitiators, thermal initiators, polymerization inhibitors, solvents, light stabilizers (such as, but not limited to, ultraviolet light absorbers and light stabilizers, such as hindered amine light stabilizers (HALS)), heat stabilizers, mold release agents, rheology control agents, leveling agents (such as, but not limited to, surfactants), free radical scavengers, self-assembling materials, gelators, and adhesion promoters (such as hexanediol diacrylate and coupling agents). These materials are known to those skilled in the art.

Still further, the sheet or coating may comprise at least one conventional photochromic compound. As used herein, the term "conventional photochromic compound" includes both thermally reversible and non-thermally reversible (or photo-reversible) photochromic compounds, and excludes photochromic-dichroic compounds.

The display elements according to the present invention may optionally further comprise at least one additional coating chosen from conventional photochromic coatings, anti-reflective coatings, linearly polarizing coatings, circularly polarizing coatings, elliptically polarizing coatings, transitional coatings, primer coatings, and protective coatings such as antifogging coatings, oxygen barrier coatings, and ultraviolet light absorbing coatings connected to at least a portion of the substrate. As used herein the term "transitional coating" means a coating that aids in creating a gradient in properties between two coatings. For example, although not limiting herein, a transitional coating may aid in creating a gradient in hardness between a relatively hard coating and a relatively soft coating. Examples of transitional coatings include radiation-cured acrylate-based thin films.

In addition to the alignment layer described above, the display elements according to the present invention may further comprise at least one coating comprising an at least partially ordered alignment transfer material interposed between the alignment layer and the photochromic-dichroic compound and/or the dichroic compound (or film or coating comprising the same). Still further, the display elements may comprise a plurality of coatings comprising an alignment transfer interposed between the alignment layer and the photochromic-dichroic compound. For example, although not limiting herein, the display element may comprise at least one alignment layer comprising a coating comprising an at least partially ordered alignment medium connected to the substrate, and a coating comprising an at least partially ordered alignment transfer material connected to the alignment layer. Further, the photochromic-dichroic compound and/or dichroic compound may be at least partially aligned by interaction with the alignment transfer material. Examples of alignment transfer materials that are suitable for use in the display element include, without limitation, those liquid crystal materials described above in connection with the alignment media disclosed herein.

Although not limiting herein, the alignment layer may have a thickness that varies widely depending upon the final application and/or the processing equipment employed, such as, for example, from at least 0.5 nanometers to 10,000 nanometers, such as 0.5 to 1,000 nanometers, such as 2 to 500 nanometers, such as 100 to 500 nanometers.

The sheet or coating comprising the alignment transfer material may have a thickness that varies widely depending upon the final application and/or the processing equipment employed, such as, for example, from 0.5 microns to 1000 microns, such as 1 to 25 microns, such as 5 to 20 microns.

The sheet or coating comprising the photochromic-dichroic compound and/or the dichroic compound may have a thickness that varies widely depending upon the final application and/or the processing equipment employed, such as, for example, from 0.5 microns to 1,000 microns, such as 1 to 25 microns, such as 5 to 20 microns.

The display elements of the present invention may further comprise a birefringent layer. The birefringent layer is operable to circularly or elliptically polarize transmitted radiation. When a circular polarizing element is desired, the birefringent layer comprises a quarter-wave plate. The birefringent layer, also called a compensation plate or layer or a retardation plate or layer, may be composed of one sheet or may be a multiple layer structure of two or more.

The birefringent layer may comprise a layer having a first ordered region having a first general direction, and at least one second ordered region adjacent the first ordered region having a second general direction that is the same or different from the first general direction so as to form a desired pattern in the layer.

The material used to prepare the birefringent layer is not particularly limited, and may be any birefringent material known in the art. For example, a polymer film, a liquid crystal film, self-assembling materials, or a film in which a liquid crystal material is aligned may be used. Examples of particular birefringent layers include those described in U.S. Pat. No. 6,864,932 at column 3, line 60 to column 4, line 64; U.S. Pat. No. 5,550,661 at column 4, line 30 to column 7, line 2; U.S. Pat. No. 5,948,487 at column 7, line 1 to column 10, line 10, each of which is incorporated herein by reference.

Examples of specific birefringent films include film Model No. NRF-140, a positively birefringent, uniaxial film available from Nitto Corporation, Japan, or Nitto Denko America, Inc., New Brunswick, N.J. Also suitable are OPTI-GRAFIX circular polarizer films, available from GRAFIX Plastics, a division of GRAFIX, Inc., Cleveland, Ohio.

Specific polymeric sheets used to prepare the birefringent layer may comprise polyacrylates, polymethacrylates, poly ($C_1$-$C_{12}$) alkyl methacrylates, polyoxy(alkylene methacrylates), poly (alkoxylated phenol methacrylates), cellulose acetate, cellulose triacetate, cellulose acetate propionate, cellulose acetate butyrate, poly(vinyl acetate), poly(vinyl alcohol), poly(vinyl chloride), poly(vinylidene chloride), poly(vinylpyrrolidone), poly((meth)acrylamide), poly(dimethyl acrylamide), poly(hydroxyethyl methacrylate), poly((meth)acrylic acid), thermoplastic polycarbonates, polyesters, polyurethanes, polythiourethanes, poly(ethylene terephthalate), polystyrene, poly(alpha methyl styrene), copoly(styrene-methylmethacrylate), copoly(styrene-acrylonitrile), polyvinylbutyral and polymers of members of the group consisting of polyol(allyl carbonate)monomers, mono-functional acrylate monomers, mono-functional methacrylate monomers, polyfunctional acrylate monomers, polyfunctional methacrylate monomers, diethylene glycol dimethacrylate monomers, diisopropenyl benzene monomers, alkoxylated polyhydric alcohol monomers and diallylidene pentaerythritol monomers; and in particular self-assembling materials, polycarbonate, polyamide, polyimide, poly(meth)acrylate, polycyclic alkene, polyurethane, poly (urea)urethane, polythiourethane, polythio(urea)urethane, polyol(allyl carbonate), cellulose acetate, cellulose diacetate, cellulose triacetate, cellulose acetate propionate, cellulose acetate butyrate, polyalkene, polyalkylene-vinyl acetate, poly(vinylacetate), poly(vinyl alcohol), poly(vinyl chloride), poly(vinylformal), poly(vinylacetal), poly(vinylidene chloride), poly(ethylene terephthalate), polyester, polysulfone, polyolefin, copolymers thereof, and/or mixtures thereof.

The birefringent layer may be incorporated into the display element in such a way that a slow axis direction (direction where a refractive index is largest in a plane) of the birefringent layer is oriented with respect to an alignment direction of the polarizer to yield the desired resultant polarization; i.e., circular or elliptical. For example, a quarter-wave plate would be oriented at an angle of 45°+/−5° with respect to an alignment direction of the polarization produced by the photochromic-dichroic compound and/or dichroic compound, such as 45°+/−3°.

Alternatively, the resultant polarization of the display element may be determined by setting the thickness of the birefringent layer. For example, to yield a circular polarizing element, the thickness of the birefringent layer is such that the emerging refracted rays of light are out of phase by one-quarter wavelength.

According to the present invention, methods of making a display element are also disclosed. The method of making the display element may comprise forming a coating comprising an at least partially aligned photochromic-dichroic compound and/or dichroic compound on a substrate or film. The method of making the display element may comprise forming a first coating comprising an at least partially aligned photochromic-dichroic compound, and forming a second coating comprising an at least partially aligned dichroic compound on the substrate or film. The method of making the display element may comprise forming a first coating comprising an at least partially aligned dichroic compound, and forming a second coating comprising an at least partially aligned photochromic-dichroic compound on the substrate or film.

According to the present invention, forming the coating comprising the photochromic-dichroic compound and/or dichroic compound may comprise applying the photochromic-dichroic compound and/or dichroic compound and an anisotropic material to the substrate or film, at least partially ordering the anisotropic material, and at least partially aligning the photochromic-dichroic compound and/or dichroic compound with the anisotropic material. Methods of applying the photochromic-dichroic compound and/or dichroic compound and the anisotropic material to the substrate or film that may be used in conjunction with the methods of the present invention include, but are not limited to, spin coating, spray coating, spray and spin coating, curtain coating, flow coating, dip coating, injection molding, casting, roll coating, wire coating, and overmolding.

According to the present invention, applying the photochromic-dichroic compound and the anisotropic material to the substrate may comprise forming a coating of the anisotropic material on a mold, which may be treated with a release material. Thereafter, the anisotropic material may be at least partially ordered (as discussed in more detail below) and at least partially set. Thereafter, the substrate can be formed over the coating (i.e., overmolding), for example, by casting the substrate forming material in the mold. The substrate forming material can then be at least partially set to form the substrate. Subsequently, the substrate and the coating of the anisotropic material can be released from the mold. Further, the photochromic-dichroic compound can be applied to the mold with the anisotropic material, or it can be imbibed into the anisotropic material after the anisotropic material has been applied to the mold, after the anisotropic material has been at least partially ordered, or after the substrate with the coating of the ordered anisotropic material has been released from the mold.

According to the present invention, forming the coating comprising the photochromic-dichroic compound and/or dichroic compound may comprise applying an anisotropic material to the substrate or film, imbibing a photochromic-dichroic compound and/or a dichroic compound into the anisotropic material, at least partially ordering the anisotropic material, and at least partially aligning the photochromic-dichroic compound and/or dichroic compound with the anisotropic material. Methods of imbibing photochromic-dichroic compounds into various coatings are described herein below in more detail.

Methods of ordering the anisotropic material include exposing the anisotropic material to at least one of a magnetic field, an electric field, linearly polarized ultraviolet radiation, linearly polarized infrared radiation, linearly polarized visible radiation, and a shear force. Further, the anisotropic material may be at least partially ordered by aligning the anisotropic material with another material or structure. For example, although not limiting herein, the anisotropic material can be at least partially ordered by aligning the anisotropic material with an alignment layer, such as, but not limited to, those alignment layers previously discussed.

As previously described, by ordering at least a portion of the anisotropic material, it is possible to at least partially align the photochromic-dichroic compound and/or dichroic compound contained within or otherwise connected to the anisotropic material. Further, applying the photochromic-dichroic compound and/or dichroic compound and the anisotropic material to the substrate can occur at essentially the same time as, prior to, or after ordering the anisotropic material and/or aligning the photochromic-dichroic compound and/or the dichroic compound.

Applying the coating materials may comprise spin coating a solution or mixture of the photochromic-dichroic compound and/or dichroic compound and anisotropic material (optionally in a solvent or carrier) onto the substrate. Thereafter, the anisotropic material may be at least partially ordered, for example, by exposing the anisotropic material to a magnetic field, an electric field, linearly polarized ultraviolet radiation, linearly polarized infrared radiation, linearly polarized visible radiation, or a shear force. Further the anisotropic material may be at least partially ordered by aligning the anisotropic material with another material or structure, for example, an alignment layer.

According to the present invention, a solution or mixture (optionally in a solvent or carrier) of the photochromic-dichroic compound and/or dichroic compound and the anisotropic material can be applied to an ordered polymeric sheet to form a coating. Thereafter, the anisotropic material may be allowed to align with the polymeric sheet. The polymeric sheet may be subsequently applied to a substrate by, for example, but not limited to, laminating or bonding. Alternatively, the coating may be transferred from the polymeric sheet to the substrate by methods known in the art, such as, but not limited to hot stamping.

According to the present invention, applying the photochromic-dichroic compound and/or dichroic compound and anisotropic material to the substrate may comprise applying a phase-separating polymer system comprising a matrix phase-forming material comprising a liquid crystal material and a guest phase-forming material comprising the anisotropic material and photochromic-dichroic compound and/or dichroic compound. After applying the phase-separating polymer system, the liquid crystal material of the matrix phase and the anisotropic material of the guest phase may be at least partially ordered, such that the photochromic-dichroic compound and/or dichroic compound is aligned with the anisotropic material of the guest phase. Methods of at least partially ordering the matrix phase-forming material and the guest phase-forming material of the phase-separating polymer system include exposing the coating comprising the phase-separating polymer system to at least one of: a magnetic field, an electric field, linearly polarized infrared radiation, linearly polarized ultraviolet radiation, linearly polarized visible radiation, and a shear force. Further, at least partially ordering the matrix phase-forming material and the guest phase-forming material may comprise at least partially aligning the portions with an alignment layer.

After at least partially ordering the matrix phase-forming material and the guest phase-forming material, the guest phase-forming material may be separated from the matrix phase-forming material by polymerization induced phase separation and/or solvent induced phase separation. Although for clarity the separation of the matrix and guest phase-forming materials is described herein in relation to the guest phase-forming material separating from the matrix phase-forming material, it should be appreciated that this language is intended to cover any separation between the two phase-forming materials. That is, this language is intended to cover separation of the guest phase-forming material from the matrix phase-forming material and separation of the matrix phase-forming material from the guest phase-forming material, as well as, simultaneous separation of both phase-forming materials and any combination thereof.

The matrix phase-forming material may comprise a liquid crystal material chosen from liquid crystal monomers, liquid crystal pre-polymers, and liquid crystal polymers. Further, the guest phase-forming material may comprise a liquid crystal material chosen from liquid crystal mesogens, liquid crystal monomers, and liquid crystal polymers and pre-polymers.

According to the present invention, forming the coating comprising the photochromic-dichroic compound and/or dichroic compound may comprise applying an anisotropic material to the substrate or film, imbibing the photochromic-dichroic compound and/or dichroic compound into the anisotropic material, at least partially ordering the anisotropic material, and at least partially aligning the photochromic-dichroic compound and/or dichroic compound with the anisotropic material. Further, at least partially ordering the anisotropic material may occur before imbibing the photochromic-dichroic compound and/or dichroic compound thereinto.

For example, the photochromic-dichroic compound and/or dichroic compound may be imbibed into the anisotropic material, for example, by applying a solution or mixture of the photochromic-dichroic compound and/or dichroic compound in a carrier to a portion of the anisotropic material and allowing the photochromic-dichroic compound and/or dichroic compound to diffuse into the anisotropic material, either with or without heating. Further, the anisotropic material may be part of a phase-separated polymer coating as described above.

The method of making a display element may also comprise imparting at least one alignment layer to a substrate, subsequently forming a coating comprising an at least partially aligned photochromic-dichroic compound on the alignment layer, impart at least one alignment layer onto the formed coating, and subsequently forming a coating comprising an at least partially aligned dichroic compound on the alignment layer. Imparting the alignment layer to the substrate may comprise at least one of: forming a coating comprising an at least partially ordered alignment medium on the substrate, applying an at least partially ordered polymer sheet to the substrate, treating the substrate, and forming a Langmuir-Blodgett film on the substrate.

Although not required, imparting the alignment layer may comprise forming a coating of an at least partially ordered alignment medium, the alignment medium may be at least partially set. Further, setting the alignment medium may occur at essentially the same time as aligning the alignment medium or it can occur after aligning the alignment medium. Still further, setting the alignment medium may comprise at least partially curing the medium by exposing it to infrared, ultraviolet, gamma, microwave or electron radiation so as to initiate the polymerization reaction of the polymerizable components or cross-linking with or without a catalyst or initiator. If desired or required, this may be followed by a heating step.

As discussed above, subsequent to imparting the alignment layer on the substrate, a coating comprising an at least partially aligned photochromic-dichroic compound and/or dichroic compound may be formed on the alignment layer.

Further, as previously discussed in relation to coatings comprising interpenetrating polymer networks, the polymerizable composition may be an isotropic material or an anisotropic material, provided that the coating comprising the photochromic-dichroic compound and/or dichroic compound is, on the whole, anisotropic.

According to the present invention, forming a sheet may comprise applying a phase-separating polymer system comprising a matrix phase-forming material comprising a liquid crystal material, a guest phase-forming material comprising a liquid crystal material, and at least one photochromic-dichroic compound and/or dichroic compound onto a substrate. Thereafter, the matrix phase-forming material and the guest phase-forming material may be at least partially ordered, and the photochromic-dichroic compound and/or dichroic compound may be at least partially aligned with the guest phase-forming material. After alignment, the guest phase-forming material may be separated from the matrix phase-forming material by polymerization induced phase-separation and/or solvent induced phase-separation, and the phase-separated polymer coating can be removed from the substrate to form the sheet.

Alternatively, the phase-separating polymer system may be applied on the substrate, ordered and aligned as discussed above, and thereafter removed from the substrate to form a phase-separated polymer sheet. Subsequently, a photochromic-dichroic compound and/or dichroic compound may be imbibed into the sheet. Alternatively, or additionally, a photochromic-dichroic compound and/or dichroic compound may be imbibed into the coating prior to removing the coating from the substrate to form the sheet.

According to the present invention, forming the sheet may comprise forming an at least partially ordered liquid crystal polymer sheet and imbibing liquid crystal mesogens and a photochromic-dichroic compound and/or dichroic compound into the liquid crystal polymer sheet. For example, a sheet comprising a liquid crystal polymer may be formed and at least partially ordered by a method of forming a polymer sheet that at least partially order the liquid crystal polymer during formation, for example by extrusion. Alternatively, a liquid crystal polymer can be cast onto a substrate and at least partially ordered by one of the methods of ordering liquid crystal materials set forth above. For example, although not limiting herein, the liquid crystal material may be exposed to a magnetic or an electric field. After being at least partially ordered, the liquid crystal polymer may be at least partially set and removed from the substrate to form a sheet comprising an at least partially ordered liquid crystal polymer matrix. Still further, a liquid crystal polymer sheet may be cast, at least partially set, and subsequently stretched to form a sheet comprising an at least partially ordered liquid crystal polymer.

After forming the sheet comprising the at least partially ordered liquid crystal polymer, a liquid crystal mesogen and a photochromic-dichroic compound and/or dichroic compound may be imbibed into the liquid crystal polymer matrix. For example, although not limiting herein, the liquid crystal mesogen and the photochromic-dichroic compound and/or dichroic compound may be imbibed into the liquid crystal polymer by applying a solution or mixture of the liquid crystal mesogen and the photochromic-dichroic compound and/or dichroic compound in a carrier to the liquid crystal polymer and, thereafter, allowing the liquid crystal mesogen and the photochromic-dichroic compound and/or dichroic compound to diffuse into the liquid crystal polymer sheet, either with or without heating. Alternatively, the sheet comprising the liquid crystal polymer may be immersed into a solution or mixture of the liquid crystal mesogen and the photochromic-dichroic compound and/or dichroic compound in a carrier and the liquid crystal mesogen and the photochromic-dichroic compound and/or dichroic compound may be imbibed into the liquid crystal polymer sheet by diffusion, either with or without heating.

According to the present invention, forming the sheet may comprise forming a liquid crystal polymer sheet, imbibing the liquid crystal polymer sheet with a liquid crystal mesogen and a photochromic-dichroic compound and/or dichroic compound (for example as discussed above), and thereafter at least partially ordering the liquid crystal polymer, the liquid crystal mesogen, and the photochromic-dichroic compound and/or dichroic compound distributed therein. Although not limiting herein, for example, the liquid crystal polymer sheet, the liquid crystal mesogen, and the photochromic-dichroic compound and/or dichroic compound distributed therein can be at least partially ordered by stretching the liquid crystal polymer sheet. Further, the liquid crystal polymer sheet may be formed using conventional polymer processing techniques, such as, but not limited to, extrusion and casting.

According to the present invention, a photo-oriented polymer sheet comprising a coating of an anisotropic material and a photochromic-dichroic compound and/or dichroic compound may be applied to the substrate. For example, the photo-oriented polymer sheet may be formed by applying a layer of a photo-orientable polymer network on a release layer and subsequently ordering and at least partially curing the photo-orientable polymer network; forming a coating of an anisotropic material and a photochromic-dichroic compound and/or dichroic compound on the layer comprising the photo-orientable polymer network, at least partially aligning the anisotropic material and the photochromic-dichroic compound and/or dichroic compound with the photo-orientable polymer network, and curing the anisotropic material. The release layer may then be removed and the layer of the photo-orientable polymer network comprising the coating of the anisotropic material and the photochromic-dichroic compound from the release layer to form the ordered polymeric sheet.

Further, connecting the polymeric sheet comprising the photochromic-dichroic compound and/or dichroic compound to the substrate may comprise, for example, at least one of: laminating, fusing, in-mold casting, and adhesively bonding the polymeric sheet to the substrate. As used herein, the in-mold casting includes a variety of casting techniques, such as but not limited to: overmolding, wherein the sheet is placed in a mold and the substrate is formed (for example by casting) over at least a portion of the sheet; and injection molding, wherein the substrate is formed around the sheet.

As discussed above, the display element may optionally comprise a birefringent layer. The birefringent layer may be applied by, for example, laminating or adhesive bonding. Alternatively, the birefringent layer may be applied by methods known in the art, such as hot stamping. Suitable adhesives for connecting the birefringent layer include those disclosed in U.S. Pat. No. 6,864,932 at column 4, line 65 through column 60, incorporated herein by reference.

As previously discussed, the present invention is directed to display elements and devices. Further, as previously discussed, as used herein the term "display" means the visible representation of information in words, numbers, symbols, designs or drawings. Examples of display devices include screens and monitors.

The display device of the present invention includes the display element described above. The display device may comprise an organic light emitting diode (OLED), a light emitting diode (LED), a liquid crystal display (LCD), a plasma display panel (PDP), an electroluminescent display (ELD), or a cathode ray tube (CRT).

The display device may comprise a light-emitting source, such as a light-emitting layer, and the display element of the present invention. The display device may optionally further comprise a reflective backing layer that assists in directing the radiation generated from the light-emitting source out of the display device through the display element. The display element comprises at least one layer comprising the photochromic-dichroic compound, the dichroic compound, or combinations thereof. The display device may further comprise a birefringent layer. The birefringent layer may comprise a quarter-wave plate (also known as a quarter-wave retarder).

The light generated by the light-emitting source may be referred to as display light. The dichroic compound and/or photochromic-dichroic compound of the display element will linearly polarize and absorb a portion of the display light as it passes through the display element. As discussed above, the display element will transmit radiation at different percentages (% T) in the first state and second state of the display element.

In addition to the display light, ambient or environmental light may be transmitted into the display device through the display element. As ambient or environmental light passes through the display element, at least a portion of the light is linearly polarized and/or absorbed by the dichroic compound and/or photochromic/dichroic compound. After passing through the layer(s) comprising the photochromic-dichroic compound and/or dichroic compound, the ambient or environmental light may pass through a birefringent layer such as a quarter wave plate that transforms the linearly polarized light into circularly polarized light. The axis of the quarter-wave plate may be oriented at 45 degrees with respect to the axis of the linear polarizing layer(s) that comprise the photochromic-dichroic compound and/or dichroic compound. Thus, as the ambient or environmental linearly polarized light passes through the quarter-wave plate, it is converted to circularly polarized light. At least a portion of the circularly polarized light may pass through the light-emitting source and may be reflected by the reflective backing layer wherein the propagation of the circularly polarized light is in the opposite direction (e.g., from right-hand circularly polarized to left-hand circularly polarized light). The reflected circularly polarized light may then pass back through the light-emitting source into the quarter wave plate. As the circularly polarized light passes through the quarter-wave plate the second time, it is converted into linearly polarized light whose plane of polarization is rotated 90 degrees with respect to the original orientation of the linearly polarized ambient or environmental light, and the linear polarizing layer(s) that comprises the photochromic-dichroic compound and/or dichroic compound effectively absorbs or blocks the returning reflected light from being transmitted back through the display element. The resultant reflected light is thus reduced in intensity compared to the initial intensity of the ambient or environmental light that passed through the display element of the present invention. Ambient or environmental light is directed towards the display device from many different incident angles, and not every angle of ambient or environmental light will pass through the display element in this manner. However, the transmission of reflected light through the display element is reduced compared to the transmission of the light generated from the light-emitting source that only passes through the display element once. This results in improved readability of the display device in bright or sunny conditions.

Furthermore, as discussed above, the transmission percentage of the display element varies. For example, in the first state most, if not all, of the photochromic-dichroic compound is un-activated, and does not linearly polarize or absorb radiation. Accordingly, any linear polarization or absorption of radiation is provided by the dichroic compound, and the display element transmits a larger percentage of radiation. As the photochromic-dichroic compound is activated, the photochromic-dichroic compound linearly polarizes and absorbs radiation. Accordingly, the linear polarization and absorption of radiation is enhanced, and the display element transmits a reduced percentage of radiation compared to the first state. Appropriate transmission percentages for the first and second states of the display element are discussed above.

For purposes of the detailed description, it is to be understood that the invention may assume various alternative variations and step sequences, except where expressly specified to the contrary. Moreover, other than in any operating examples, or where otherwise indicated, all numbers such as those expressing values, amounts, percentages, ranges, subranges and fractions may be read as if prefaced by the word "about," even if the term does not expressly appear. Accordingly, unless indicated to the contrary, the numerical parameters set forth in the following specification and attached claims are approximations that may vary depending upon the desired properties to be obtained by the present invention. At the very least, and not as an attempt to limit the application of the doctrine of equivalents to the scope of the claims, each numerical parameter should at least be construed in light of the number of reported significant digits and by applying ordinary rounding techniques. Where a closed or open-ended numerical range is described herein, all numbers, values, amounts, percentages, subranges and fractions within or encompassed by the numerical range are to be considered as being specifically included in and belonging to the original disclosure of this application as if these numbers, values, amounts, percentages, subranges and fractions had been explicitly written out in their entirety.

Notwithstanding that the numerical ranges and parameters setting forth the broad scope of the invention are approximations, the numerical values set forth in the specific examples are reported as precisely as possible. Any numerical value, however, inherently contains certain errors necessarily resulting from the standard variation found in their respective testing measurements.

As used herein, unless indicated otherwise, a plural term can encompass its singular counterpart and vice versa, unless indicated otherwise. For example, although reference is made herein to "a" photochromic-dichroic compound, "a" dichroic compound, "a" substrate, "a" sheet, and "a" coating, a combination (i.e., a plurality) of these components can be used. In addition, in this application, the use of "or" means "and/or" unless specifically stated otherwise, even though "and/or" may be explicitly used in certain instances.

As used herein, "including," "containing" and like terms are understood in the context of this application to be synonymous with "comprising" and are therefore open-ended and do not exclude the presence of additional undescribed or unrecited elements, materials, ingredients or method steps. As used herein, "consisting of" is understood in the context of this application to exclude the presence of any unspecified element, ingredient or method step. As used herein, "consisting essentially of" is understood in the context of this application to include the specified elements, materials, ingredients or method steps "and those that do not materially affect the basic and novel characteristic(s)" of what is being described.

As used herein, the terms "on," "onto," "applied on," "applied onto," "formed on," "deposited on," "deposited onto," mean formed, overlaid, deposited, or provided on but not necessarily in contact with the surface. For example, coating "deposited onto" a substrate does not preclude the presence of one or more other intervening coating layers of the same or different composition located between the coating and the substrate.

Whereas specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the claims appended and any and all equivalents thereof.

Aspects

The present invention thus relates inter alia to the following non-limiting Aspects 1 to 17:

1. A display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80%, and the second absorption state has a transmittance percentage of 10% to 50%.

2. The display element according to Aspect 1, wherein the first absorption state has a transmittance percentage of 60% to 70%, and the second absorption state having a transmittance percentage of 15% to 40%.

3. The display element according to Aspect 1 or Aspect 2, wherein the first absorption state has a linear polarization efficiency of 5% to 70%, and the second absorption state has a linear polarization efficiency of 50% to 99.9%.

4. The display element according to any one of the preceding Aspects, wherein the photochromic-dichroic compound comprises a pyran photochromic group, wherein the pyran photochromic group preferably comprises a naphthopyran.

5. The display element according to any one of the preceding Aspects, wherein the dichroic compound comprises an anthraquinone dye, an azo dye, or combinations thereof.

6. The display element according to any one of the preceding Aspects, wherein the display element comprises a sheet comprising the photochromic-dichroic compound and the dichroic compound or comprises a first sheet comprising the photochromic-dichroic compound and a second sheet comprising the dichroic compound.

7. The display element according to any one of the preceding Aspects, further comprising a substrate.

8. The display element according to Aspect 7, further comprising a coating connected to the substrate, the coating comprising the photochromic-dichroic compound and the dichroic compound, wherein the coating preferably comprises at least one self-assembling material such as a self-assembling material comprising liquid crystal materials, block copolymers and combinations thereof.

9. The display element according to Aspect 7, further comprising an alignment layer, for example an alignment layer that comprises a photoalignment layer, and a coating comprising the photochromic-dichroic compound and the dichroic compound, wherein the coating is connected to the alignment layer.

10. The display element according to Aspect 7, further comprising a first coating connected to the substrate, the first coating comprising the photochromic-dichroic compound, and a second coating connected to the substrate, the second coating comprising the dichroic compound.

11. The display element according to any one of the preceding Aspects, further comprising a birefringent layer, wherein the birefringent layer preferably comprises a quarter-wave plate.

12. The display element according to any one of the preceding Aspects, wherein a weight ratio of the dichroic compound to the photochromic-dichroic compound is from 0.005:1 to 0.150:1.

13. A display device comprising the display element according to any one of the preceding Aspects 1 to 12.

14. The display device according to Aspect 13, wherein the display device further comprises an organic light emitting diode, a light emitting diode, a liquid crystal display, a plasma display panel, an electroluminescent display, or a cathode ray tube.

15. The display device according to Aspect 13, further comprising:
   a light emitting layer;
   a reflective backing layer;
   a quarter-wave retarder; and
   at least one layer comprising the photochromic-dichroic compound, the dichroic compound, or combinations thereof.

16. The display device according to Aspect 15, wherein the light emitting layer comprises a light emitting diode or an organic light emitting diode.

17. The display device according to any one of Aspects 15 or 16, wherein the display device comprises a first layer and a second layer, wherein the first layer comprises the photochromic-dichroic compound, and the second layer comprises the dichroic compound, wherein preferably the quarter-wave retarder is connected to the first layer, and the first layer is connected to the second layer.

Illustrating the invention are the following examples, which, however, are not to be considered as limiting the invention to their details. Unless otherwise indicated, all parts and percentages in the following examples, as well as throughout the specification, are by weight.

EXAMPLES

Example A—Liquid Crystal Coating Components and Formulations

Liquid Crystal Monomer Compositions

The following liquid crystal monomer ("LCM") compositions were prepared:

LCM-1 was 1-(6-(8-(4-(4-(4-(4-(8-acryloyloxyhexyl)oxy)benzoyloxy)phenyloxycarbonyl)phenoxy)octyloxy-6-oxohexyloxy-6-oxohexyloxy)-6-oxohexyloxy)-6-oxohexyloxy)-6-oxohexyloxy)-6-oxohexyloxy)-6-oxohexan-1-ol which was prepared according to the procedures described in Example 17 of U.S. Pat. No. 7,910,019, which liquid crystal monomer disclosure is incorporated herein by reference.

LCM-2 was commercially available RM257 reported to be 4-(3-acryloyloxypropyloxy)-benzoic acid 2-methyl-1,4-phenylene ester, available from EMD Chemicals, Inc., having the molecular formula of $C_{33}H_{32}O_{10}$.

LCM-3 was 1-(6-(4-(4-(trans-4-pentylcyclohexyl)phenoxycarbonyl)phenoxy)hexyloxy)-2-methylprop-2-en-1-one prepared according to the procedure of Example 1 in U.S. Pat. No. 7,910,019, except that n=0, which disclosure is incorporated herein by reference.

LCM-4 was 1-(6-(6-(6-(6-(6-(6-(6-(8-(4-(4-(4-hexyloxybenzoyloxy)phenoxycarbonyl)-phenoxy)octyloxy)-6-oxohexyloxy)-6-oxohexyloxy)-6-oxohexyloxy)-6-oxohexyloxy)-6-oxohexyloxy)-6-oxohexyloxy)-6-oxohexyloxy)-2-methylprop-2-en-1-one prepared according to the procedures of U.S. Pat. No. 7,910,019, which disclosure is incorporated herein by reference.

LCM-5 was commercially available RM105 available from EMD Chemicals, Inc and is reported to have the molecular formula of $C_{23}H_2O_6$.

Photochromic-Dichroic Grey Coloring Formulation (Grey-1)

A photochromic-dichroic grey coloring formulation, referred to herein as Grey-1, was prepared by combining the photochromic-dichroic ("PC") dyes listed in Table A below.

TABLE A

Photochromic Dyes in Grey-1 Coloring Formulation

| Dye | Description | Amount (weight percent based on the total weight of the coloring formulation) |
|---|---|---|
| PC-A | Indenonaphthopyran that demonstrates a yellow color upon activation (as described in Example 25 of U.S. Pat. No. 8,518,546) | 23.0 |
| PC-B | Indenonaphthopyran that demonstrates a blue-green color upon activation (as described in Example 33 of U.S. Pat. No. 8,545,984) | 15.0 |
| PC-C | Indenonaphthopyran that demonstrates a blue color upon activation (as described in Example 22 of U.S. Pat. No. 8,518,546) | 10.0 |
| PC-D | Indenonaphthopyran that demonstrates a blue color upon activation (as described in Example 15 of U.S. Pat. No. 8,545,984) | 25.0 |
| PD-E | Indenonaphthopyran that demonstrates a blue color upon activation (as described in Example 14 of U.S. Pat. No. 8,545,984) | 27.0 |

Liquid Crystal Coating Formulations ("LCCF")

LCCF-1 was prepared as follows: To a suitable flask containing a mixture of anisole (3.99 g) and BYK-322 additive 0.004 g, reported to be an aralkyl modified polymethyl-alkyl-siloxane available from BYK Chemie, USA), was added LCM-1 (1.08 g), LCM-2 (2.4 g), LCM-3 (1.08 g), LCM-4 (1.44 g), Grey-1 (0.72 g), 4-methoxyphenol (0.006 g) and IRGACURE® 819 (0.09 g, a photoinitiator available from Ciba-Geigy Corporation). CYASORB® UV-24, a light absorber available from Cytec Industries, was also added at a molar ratio of 1:4 (UV-24: Grey-1). The resulting mixture was stirred for 2 hours at 80° C. and cooled to about 26° C.

LCCF-2 was prepared as follows: To a suitable flask containing a mixture of anisole (3.99 g) and BYK-322 additive 0.004 g, reported to be an aralkyl modified polymethyl-alkyl-siloxane available from BYK Chemie, USA), was added LCM-2 (3.0 g), LCM-5 (3.0 g), Dichroic Dye Blue AB2 Batch 3 from Nematel GmbH & Co. KG (0.06 g), Dichroic Dye Orange AZ01 Batch 1 from Nematel GmbH & Co. KG (0.06 g), 4-methoxyphenol (0.06 g) and IRGACURE® 819 (0.09 g, a photoinitiator available from Ciba-Geigy Corporation). The resulting mixture was stirred for 2 hours at 80° C. and cooled to about 26° C.

LCCF-3 was prepared as follows: To a suitable flask containing a mixture of anisole (3.99 g) and BYK-322 additive 0.004 g, reported to be an aralkyl modified polymethyl-alkyl-siloxane available from BYK Chemie, USA), was added LCM-1 (1.08 g), LCM-2 (2.4 g), LCM-3 (1.08 g), LCM-4 (1.44 g), Grey-1 (0.72 g), Dichroic Dye Blue AB2 Batch 3 from Nematel GmbH & Co. KG (0.012 g), Dichroic Dye Orange AZ01 Batch 1 from Nematel GmbH & Co. KG (0.06 g), 4-methoxyphenol (0.006 g) and IRGACURE® 819 (0.09 g, a photoinitiator available from Ciba-Geigy Corporation). CYASORB® UV-24, a light absorber available from Cytec Industries, was also added at a molar ratio of 1:4 (UV-24: Grey-1). The resulting mixture was stirred for 2 hours at 80° C. and cooled to about 26° C.

Example B—Preparation of Photoalignment Coating Solution

A solution of a photo alignment material, poly[(E)-2-methoxy-4-(3-methoxy-3-oxoprop-1-enyl)phenyl 4-(6-(methacryloyloxy)hexyloxy)benzoate] was prepared by adding 6 weight percent of the photo alignment material to cyclopentanone, based on the total weight of the solution.

Example C—Procedures Used for Preparing and Coating the Substrates

Substrate

Corning 2947-75×50 mm glass plate microslides were used as the substrate. The plates had dimensions of 75×50 mm, with a thickness of 0.96 to 1.06 mm. Each substrate was cleaned by wiping with a tissue soaked with Windex® and dried with a stream of air.

Each substrate was corona treated by passing on a conveyor belt in Tantec EST Systems Serial No. 020270 Power Generator HV 2000 series corona treatment equipment with a high voltage transformer. The substrates were exposed to corona generated by 53.99 KV, 500 Watts while traveling on a conveyor at a belt speed 3 ft/min.

Coating Procedure for Photo Alignment Materials

The photo alignment coating solution prepared in Example B was applied to the test substrates by spin-coating on a portion of the surface of the test substrate by dispensing approximately 1.0 mL of the solution and spinning the substrates at 800 revolutions per minute (rpm) for 3 seconds, followed by 1,000 rpm for 7 seconds, followed by 2500 rpm for 4 seconds. A spin processor from Laurell Technologies Corp. (WS-400B-6NPP/LITE) was used for spin coating. Afterwards, the coated substrates were placed in an oven maintained at 120° C. for 30 minutes. The coated substrates were cooled to about 26° C.

The dried photo alignment layer on each of the substrates was at least partially ordered by exposure to linearly polarized ultraviolet radiation using a DYMAX® UVC-6 UV/conveyor system by DYMAX® Corp. having a 400-Watt power supply. The light source was oriented such that the radiation was linearly polarized in a plane perpendicular to the surface of the substrate. The amount of ultraviolet radiation that each photo alignment layer was exposed to was measured using a UV Power Puck™ High energy radiometer from EIT Inc (Serial No. 2066) and was as follows: UVA 0.126 W/cm$^2$ and 5.962 J/cm$^2$; UVB 0.017 W/cm$^2$ and 0.078 J/cm$^2$; UVC 0 W/cm$^2$ and 0 J/cm$^2$: and UVV 0.046 W/cm$^2$ and 2.150 J/cm$^2$. After ordering at least a portion of the photo-orientable polymer network, the substrates were cooled to about 26° C. and kept covered.

Coating Procedure for Liquid Crystal Coating Formulations

The Liquid Crystal Coating Formulations ("LCCF") prepared in Example A were each spin coated at a rate of 400 revolutions per minute (rpm) for 6 seconds, followed by 800 rpm for 4 seconds onto the at least partially ordered photoalignment materials prepared as described above on the test substrates. Each coated substrate was placed in an oven at 65° C. for 30 minutes. Afterwards the substrates were cured under two ultraviolet lamps in the UV Curing Oven Machine designed and built by Belcan Engineering in nitrogen atmosphere while running on a conveyor belt at 2 ft/min speed at peak intensity of 0.445 Watts/cm$^2$ of UVA and 0.179 Watts/cm$^2$ of UW and UV dosage of 2.753 Joules/cm$^2$ of UVA and 1.191 Joules/cm$^2$ of UW. The cured layers were exposed to corona generated by 53.00 KV, 500 Watts while traveling on a conveyor at a belt speed 3 ft/min using the corona treatment equipment described above.

Example 1

The control sample, Example 1, was coated with the photoalignment layer of Example B and the LCCF-1 coating of Example A according to the procedure of Example C. The display element of Example 1 contained photochromic-dichroic dye but no fixed-tint dichroic dyes. The layer stacking configuration is shown in FIG. 1.

Example 2

Example 2 was coated with has multilayer stack of photo alignment coating/LCCF-2 coating/photo alignment coating/LCCF-1 coatings of Examples A and B according to the procedure of Example C. The display element of Example 2 contained both photochromic-dichroic dye and dichroic dyes. The layer stacking configuration is shown in FIG. 2.

Example 3

Example 3 was coated with the photoalignment layer of Example B and the LCCF-3 coating of Example A according to the procedure of Example C. The display element of Example 3 contained both photochromic-dichroic dye and dichroic dyes. The layer stacking configuration is shown in FIG. 3.

Evaluation of Display Elements

Sample Testing: An optical bench was used to measure the optical properties of the display element and derive the absorption ratios for each of the display elements when tested for clear to polarized and clear to circular polarized properties. Prior to testing, each of the samples was exposed to activating radiation (UVA) for 10 minutes at a distance of 15 centimeters (cm) from a bank of four UV Tubes BLE-7900B supplied by Spectronics Corp. and then placed for one hour at 40° C. Subsequently, the samples were exposed for one hour at a distance of 15 cm from a bank of four UVless tubes F4OGO supplied by General Electric and finally held in the dark for one hour. Afterwards, the display elements were placed in a temperature-controlled air cell at (23° C.±0.1° C.) on the optical bench. The activating light source (a Newport/Oriel Model 67005 300-Watt Xenon arc lamp housing, 69911 power supply and 68945 digital exposure controller fitted with a Uniblitz VS25 (with VMM-D4 shutter driver) high-speed computer controlled shutter that momentarily closed during data collection so that stray light would not interfere with the data collection process, a Schott 3 mm KG-2 band-pass filter, which removed short wavelength radiation, neutral density filter(s) for intensity attenuation and a condensing lens for beam collimation) was directed at a 30° to 35° angle of incidence to the surface of the sample side.

A broadband light source for monitoring response measurements was positioned in a perpendicular manner to a surface of the display element. Increased signal of shorter visible wavelengths was obtained by collecting and combining separately filtered light from a 100-Watt tungsten halogen lamp (controlled by a Lambda UP60-14 constant voltage power supply) with a split-end, bifurcated fiber optical cable. Light from one side of the tungsten halogen lamp was filtered with a Schott KG1 filter to absorb heat and a Hoya B-440 filter to allow passage of the shorter wavelengths. The other side of the light was either filtered with a Schott KG1 filter or unfiltered. The light was collected by focusing light from each side of the lamp onto a separate end of the split-end, bifurcated fiber optic cable, and subsequently combined into one light source emerging from the single end of the cable. A 4" light pipe was attached to the single end of the cable to insure proper mixing.

Polarization of the light source was achieved by passing the light from the single end of the cable through a Moxtek, Proflux Polarizer held in a computer driven, motorized rotation stage (Model M-061-PD or M-660.55 from Polytech, PI). The monitoring beam was set so that the one polarization plane (0°) was perpendicular to the plane of the optical bench table and the second polarization plane (90°) was parallel to the plane of the optical bench table.

Prior to UV activation the display elements were aligned as follows. Electrical dark, reference and dark spectra were collected at both 0 and 90-degree polarization directions. Alignment of the polarization samples was accomplished by activating the sample for 15 minutes, then rotating the sample relative to the Moxtek analyzer polarizer until a maximum absorbance at 590 nm is achieved. At this position, the sample is aligned 90 degrees to the analyzer polarizer to +/−0.25 degrees. Once aligned, the 0/90-degree absorption spectra were collected for 120 seconds at 5 second intervals, and then the Xe arc lamp shutter is closed and the sample is allowed to fade while the Moxtek polarizer continues to rotate and collect the absorption spectra at 0 and 90 degrees as a function of time.

To conduct the clear to linear measurements, the display element was exposed to 6.7 W/m2 of UVA from the activating light source for 15 minutes to activate the photochromic-dichroic dyes. An International Light Research Spectrorradiometer (Model ILT950) with a detector system (Model SED033 detector, B Filter, and diffuser) was used to verify exposure at the beginning of each day. Light from the monitoring source that was polarized to the 0° polarization plane was then passed through the coated sample and focused on a 1" integrating sphere, which was connected to an Ocean Optics 2000 spectrophotometer using a single function fiber optic cable. The spectral information, after passing through the sample, was collected using Ocean Optics SpectraSuite and PPG propriety software. While the photochromic-dichroic dyes were activated, the position of the Moxtek polarizer was rotated back and forth to polarize the light from the monitoring light source to the 90° polarization plane and back. Data was collected for approximately 15 minutes at 5-second intervals during activation and every 3 seconds during fade. For each test, rotation of the polarizers was adjusted to collect data in the following sequence of polarization planes: 0°, 90°, 90°, 0°, etc.

Absorption spectra were obtained and analyzed for each display element using the Igor Pro software (available from WaveMetrics). The change in the absorbance in each polarization direction for each display element was calculated by subtracting out the 0-time (i.e., unactivated) absorption measurement for the display element at each wavelength tested. Photopic response measurements were collected since multiple photochromic-dichroic compounds were used in the display elements. Average absorbance values were obtained in the photopic region of the activation profile where the photochromic response was saturated or nearly saturated (i.e., the regions where the measured absorbance did not increase or did not increase significantly over time) for each display element by averaging absorbance at each time interval in this region. The average absorbance values in a predetermined range of wavelengths corresponding λmax-vis+/−5 nm were extracted for the 0° and 90° polarizations, and the absorption ratio for each wavelength in this range was calculated by dividing the larger average absorbance by the small average absorbance. For each wavelength extracted, 5 to 100 data points were averaged. The average absorption ratio for the photochromic-dichroic dyes was then calculated by averaging these individual absorption ratios. The average absorption ratio for the sample was then calculated by averaging these individual absorption ratios.

The results are reported below wherein the First Fade Half Life ("T½") value is the time interval in seconds for the ΔOD of the activated form of the photochromic-dichroic dyes in the sample to reach one half the maximum ΔOD at 73.4° F. (23° C.), after removal of the activating light source.

% T values were calculated based on CIE Y transmission for a grey/brown lens. The average transmission percentage (% T) values for initial and final and the polarization efficiency were obtained according to the following formulas:

Initial % $T$=(% $T$parallel+% $T$crossed)/2    (initial meaning un-activated)

Final % $T$=(% $T$parallel+% $T$crossed)/2    (final meaning fully-activated)

% PE=100*((% $T$parallel−% $T$crossed)/(% $T$parallel+% $T$crossed))

For each sample, the above-described procedure was run at least twice. The results of the clear to linear polarized tests are presented in Table I below.

TABLE 1

| | Clear to linear polarization | | | | | |
|---|---|---|---|---|---|---|
| Example | Initial % T | Initial % PE | Final % T | Final % PE | Fade T½ | Abs. Ratio |
| 1 (control) | 81.0 | 4 | 20.7 | 90 | 211 | 4.22 |
| 2 | 53.3 | 26 | 16.8 | 94 | 186 | 4.13 |
| 3 | 60.4 | 18 | 17.9 | 93 | 191 | 4.14 |

The clear to circular polarization studies were conducted in the same manner as the clear to linear studies except for the modifications described below. The Moxtek polarizer was moved on the PI rotation stage to the side opposite of the film assembly. In order to do circular polarization measurements, the circular polarizers need to face each other such that the quarter wave plates are facing each other. To align the system, a known Melles Griot (MG) polarizer was placed in position prior to the cell assembly, oriented at 0 degrees for maximum transmission of the laser light (Coherent Ultra-low noise laser diode module ~635 nm). The Moxtek polarizer was then rotated on the stage to achieve a null position. A quarter wave plate (from Melles Griot) was added to the optical path just before the Moxtek polarizer. The Quarter wave plate (mounted on a goniometer from Opto-Sigma which had a rotation center point 76 mm away from the top plate: this assembly was mounted on a 1.5-inch damped rod from Melles Griot) was rotated to achieve a null signal of the laser. This ensured that either the fast or slow axes of the quarter wave plate was aligned with the Moxtek polarizers transmission direction.

Next, the Moxtek polarizer was rotated 45 degrees and the MG polarizer was removed. The Moxtek polarizer now bisected the fast and slow axes of the MG quarter wave plate and produced either left hand or right hand circularly polarized light. Electrical dark, reference and dark reference spectra were collected for both left hand and right hand circularly polarized light by rotating the Moxtek Polarizer+/−90 degrees (alternatively bisecting the fast and slow axes of the MG quarter wave plate from fast to slow and then slow to fast).

With the reference spectra collected, the sample was inserted into the temperature-controlled air cell. The Moxtek polarizer was rotated 45 degrees to be horizontal and the MG polarizer (at 0 degrees) was placed in the beam path to produce a crossed polarizer configuration. The display element was placed in the beam path and the laser was directed through the crossed polarizers and sample. Alignment of the polarization samples was accomplished by activating the sample for 15 minutes, then rotating the sample relative to the Moxtek analyzer polarizer until a maximum absorbance at 590 nm is achieved. At this position, the sample is aligned 90 degrees to the analyzer polarizer to +/−0.25 degrees. Once aligned, the 0/90-degree absorption spectra were collected for 120 seconds at 5 second intervals, and then the Xe arc lamp shutter is closed and the sample is allowed to fade while the Moxtek polarizer continues to rotate and collect the absorption spectra at 0 and 90 degrees as a function of time.

Note that for Example 2, the poor-quality quarter waveplate of the sample (due to refractive index dispersion) required that the data be analyzed manually so that the correct "crossed polarization" spectrum was used. From the raw data tables that are generated by the optical bench, the bleached optical densities at the angle (to +/−2.5 degrees) where the maximum darkness in crossed polarization was found were used to back calculate the bleached CIE Y transmission (% T) and the fully activated transmission. This was done because there is some level of angular dependence between crossed circular polarizers that is due to the poor quality of the quarter wave plates across 380 to 780 nm (they are designed for 560 nm).

The data acquisition was done as before (120 second delay, 15 minutes activation at 5 second interval data collection, 30 minutes fade or to 2nd half-life at 3 second intervals. The Moxtek polarizer was rotated+/−90 degrees throughout the data collection. Since the transmission axis of the Moxtek polarizer bisected the quarter wave plate (MG), then the rotation of the Moxtek polarizer went from bisecting the fast-slow axes to bisecting the slow-fast axes, which created right hand circular polarized light in one orientation and left-hand circular polarized light in the other orientation.

Measuring the coated samples with the quarter wave plate was essentially the same process except that the laser light intensity was reduced by using a 1.0 and 0.5 ND filter. The results of the clear to circular polarization studies are listed below in Table 2.

TABLE 2

Clear to circular polarization

| Example | Initial % T | Initial % PE | Final % T | Final % PE | Fade T½ |
|---|---|---|---|---|---|
| 1 (control) with quarter wave plate | 79.7 | 4 | 20.0 | 74 | 220 |
| 2 with quarter wave plate | 52.5 | 22 | 15.8 | 75 | 140 |
| 3 with quarter wave plate | 59.7 | 16 | 17.7 | 75 | 193 |

It will be appreciated by skilled artisans that numerous modifications and variations are possible in light of the above disclosure without departing from the broad inventive concepts described and exemplified herein. Accordingly, it is therefore to be understood that the foregoing disclosure is merely illustrative of various exemplary aspects of this application and that numerous modifications and variations can be readily made by skilled artisans which are within the spirit and scope of this application and the accompanying claims.

We claim:

1. A display element comprising a photochromic-dichroic compound and a dichroic compound, the display element having a first absorption state and a second absorption state and being operable for switching from the first absorption state to the second absorption state in response to actinic radiation and to revert back to the first absorption state in response to actinic radiation and/or thermal energy, wherein the first absorption state has a transmittance percentage of 50% to 80% and a linear polarization efficiency of 5% to 70%, and the second absorption state has a transmittance percentage of 10% to 50% and a linear polarization efficiency of 50% to 99%.

2. The display element of claim 1, wherein the first absorption state has a transmittance percentage of 60% to 70%, and the second absorption state having a transmittance percentage of 15% to 40%.

3. The display element of claim 1, wherein the photochromic-dichroic compound comprises a pyran photochromic group.

4. The display element of claim 3, wherein the pyran photochromic group comprises a naphthopyran.

5. The display element of claim 1, wherein the dichroic compound comprises an anthraquinone dye, an azo dye, or combinations thereof.

6. The display element of claim 1, wherein the display element comprises a sheet comprising the photochromic-dichroic compound and the dichroic compound.

7. The display element of claim 1, wherein the display element comprises a first sheet comprising the photochromic-dichroic compound and a second sheet comprising the dichroic compound.

8. The display element of claim 1, further comprising a substrate.

9. The display element of claim 8, further comprising a coating connected to the substrate, the coating comprising the photochromic-dichroic compound and the dichroic compound.

10. The display element of claim 9, wherein the coating comprises at least one self-assembling material.

11. The display element of claim 10, wherein the self-assembling material comprises liquid crystal materials, block copolymers and combinations thereof.

12. The display element of claim 8, further comprising an alignment layer and a coating comprising the photochromic-dichroic compound and the dichroic compound, wherein the coating is connected to the alignment layer.

13. The display element of claim 12, wherein the alignment layer comprises a photoalignment layer.

14. The display element of claim 8, further comprising a first coating connected to the substrate, the first coating comprising the photochromic-dichroic compound, and a second coating connected to the substrate, the second coating comprising the dichroic compound.

15. The display element of claim 1, wherein a weight ratio of the dichroic compound to the photochromic-dichroic compound is from 0.005:1 to 0.150:1.

16. The display element of claim 1, further comprising a birefringent layer.

17. The display element of claim 16, wherein the birefringent layer comprises a quarter-wave plate.

18. A display device comprising the display element of claim 1.

19. The display device of claim 18, wherein the display device further comprises an organic light emitting diode, a light emitting diode, a liquid crystal display, a plasma display panel, an electroluminescent display, or a cathode ray tube.

20. The display device of claim 18, further comprising:
a light emitting layer;
a reflective backing layer;
a quarter-wave retarder; and
at least one layer comprising the photochromic-dichroic compound, the dichroic compound, or combinations thereof.

21. The display device of claim 20, wherein the light emitting layer comprises a light emitting diode or an organic light emitting diode.

22. The display device of claim 21, wherein the display device comprises a first layer and a second layer, wherein the first layer comprises the photochromic-dichroic compound, and the second layer comprises the dichroic compound.

23. The display device of claim 22, wherein the display device further comprises a quarter-waver plate connected to the first layer, and the first layer is connected to the second layer.

* * * * *